(12) United States Patent
Lee et al.

(10) Patent No.: US 9,431,344 B2
(45) Date of Patent: Aug. 30, 2016

(54) SEMICONDUCTOR DEVICE

(71) Applicant: SK hynix Inc., Icheon-si Gyeonggi-do (KR)

(72) Inventors: Ki Hong Lee, Suwon-si (KR); Seung Ho Pyi, Seongnam-si (KR); Jin Ho Bin, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 77 days.

(21) Appl. No.: 13/941,684

(22) Filed: Jul. 15, 2013

(65) Prior Publication Data

US 2014/0291848 A1    Oct. 2, 2014

(30) Foreign Application Priority Data

Mar. 26, 2013  (KR) ................. 10-2013-0032372

(51) Int. Cl.
| | |
|---|---|
| *H01L 23/532* | (2006.01) |
| *H01L 21/764* | (2006.01) |
| *H01L 29/66* | (2006.01) |
| *H01L 29/788* | (2006.01) |
| *H01L 29/792* | (2006.01) |
| *H01L 27/115* | (2006.01) |

(52) U.S. Cl.
CPC ....... *H01L 23/53238* (2013.01); *H01L 21/764* (2013.01); *H01L 27/11565* (2013.01); *H01L 27/11582* (2013.01); *H01L 29/66825* (2013.01); *H01L 29/66833* (2013.01); *H01L 29/7889* (2013.01); *H01L 29/7926* (2013.01); *H01L 27/11519* (2013.01); *H01L 27/11556* (2013.01); *H01L 2924/0002* (2013.01)

(58) Field of Classification Search
CPC ........... H01L 23/53238; H01L 23/532; H01L 29/66825; H01L 29/7926; H01L 21/764; H01L 29/7889; H01L 29/66833; H01L 27/11565; H01L 27/11582; H01L 27/11556; H01L 27/11519

See application file for complete search history.

(56) References Cited

U.S. PATENT DOCUMENTS

| | | | |
|---|---|---|---|
| 2010/0181612 A1* | 7/2010 | Kito et al. ..................... 257/319 |
| 2011/0057251 A1* | 3/2011 | Higashi ......................... 257/324 |
| 2011/0065270 A1* | 3/2011 | Shim et al. .................... 438/589 |
| 2011/0199825 A1* | 8/2011 | Han et al. ................. 365/185.11 |
| 2012/0092926 A1* | 4/2012 | Whang et al. ........... 365/185.01 |
| 2013/0161726 A1* | 6/2013 | Kim et al. ..................... 257/324 |
| 2013/0292757 A1* | 11/2013 | Aritome ........................ 257/316 |
| 2014/0217488 A1* | 8/2014 | Thimmegowda et al. ... 257/314 |

FOREIGN PATENT DOCUMENTS

KR    1020120041009 A    4/2012

* cited by examiner

*Primary Examiner* — Peniel M Gumedzoe
(74) *Attorney, Agent, or Firm* — William Park & Associates Ltd.

(57) ABSTRACT

A semiconductor device may include pillars and a plurality of conductive layers being stacked while surrounding the pillars and including a plurality of first regions including non-conductive material layers and a plurality of second regions including conductive material layers, wherein the first regions and the second regions are alternately arranged.

28 Claims, 27 Drawing Sheets

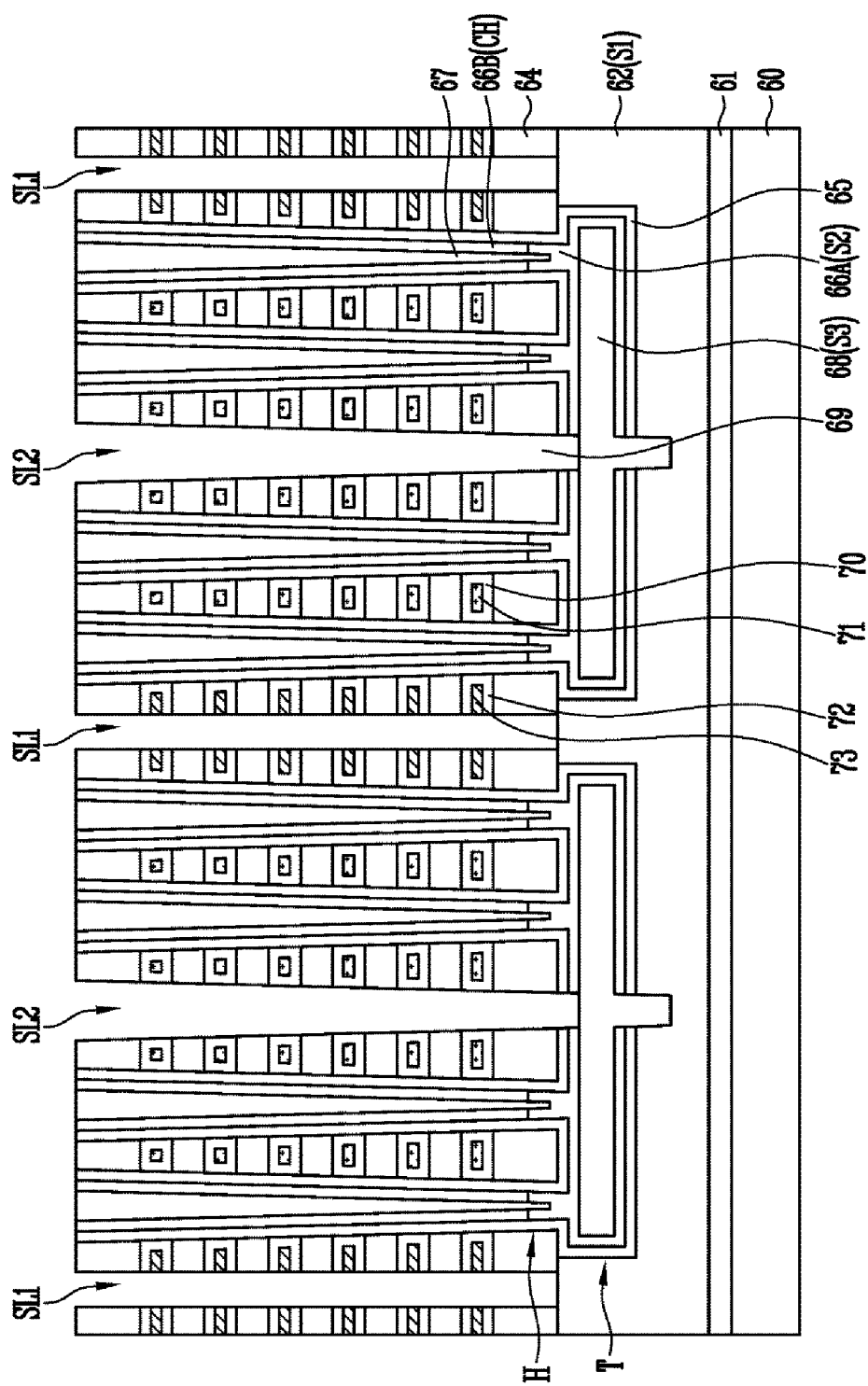

SEMICONDUCTOR DEVICE

CROSS-REFERENCE TO RELATED APPLICATION

The present application claims priority to Korean patent application number 10-2013-0032372 filed on Mar. 26, 2013, in the Korean Intellectual Property Office, the entire disclosure of which is incorporated by reference herein.

BACKGROUND

1. Technical Field

Various embodiments relate generally to an electronic device and, more particularly, to a three-dimensional semiconductor device and a manufacturing method thereof.

2. Related Art

A non-volatile memory device retains data even when a power supply is interrupted or blocked. Recently, as the integration enhancement of a two-dimensional memory device configured to manufacture a memory cell in a single layer on a silicon substrate has reached the limit, a non-volatile memory device having a three-dimensional structure where memory cells are stacked vertically over a silicon substrate has been proposed.

A three-dimensional non-volatile memory device includes interlayer insulating layers and word lines alternately stacked, and channel layers passing through the interlayer insulating layers and the word lines. Memory cells are stacked along the channel layers. Also, when manufacturing the three-dimensional non-volatile memory device, a plurality of oxide layers and a plurality of nitride layers are alternately stacked and the plurality of nitride layers are replaced with a plurality of conductive layers to form stacked word lines.

However, there is difficulty with the process of replacing the plurality of nitride layers with the plurality of conductive layers. In particular, the layers around the nitride layers may be damaged in the process of replacing the nitride layers with the conductive layers. As a result, the characteristics of the memory device may deteriorate.

BRIEF SUMMARY

Various embodiments relate to a semiconductor device.

A semiconductor device according to an embodiment of the present invention may include pillars; and a plurality of conductive layers being stacked while surrounding the pillars and having a plurality of first regions including non-conductive material layers and a plurality of second regions including conductive material layers, wherein the first regions and the second regions are alternately arranged.

A semiconductor device according to an embodiment may include pillars; first slits between the pillars; and a plurality of conductive patterns being stacked while surrounding the pillars and patterned by the first slits, wherein the conductive patterns have center regions including non-conductive material layers and side regions including conductive material layers.

A semiconductor device according to an embodiment may include pillars; and a plurality of conductive layers being stacked while surrounding the pillars and having a plurality of first regions including air gaps and a plurality of second regions including conductive material layers, wherein the first regions and the second regions are alternately arranged.

A semiconductor device according to an embodiment may include pillars; and a plurality of conductive layers being stacked while surrounding the pillars and having a plurality of first regions including barrier layers and a plurality of second regions including metal layers, wherein the first regions and the second regions are alternately arranged.

A semiconductor device according to an embodiment may include pillars; and a plurality of conductive layers including a plurality of first regions having first conductive material layers and a plurality of second regions having second and third conductive material layers, wherein the first regions and the second regions are alternately arranged, and wherein the first conductive material layers completely fill the first regions and comprise of barrier layers.

A semiconductor device according to an embodiment of the present invention may include tubes; and a plurality of conductive layers having a plurality of first regions including non-conductive material layers and a plurality of second regions including conductive material layers, wherein the first regions and the second regions are alternately arranged.

BRIEF DESCRIPTION OF THE DRAWINGS

FIGS. 8A to 8C illustrate a semiconductor device and a method of the same according to an embodiment;

DETAILED DESCRIPTION

Hereinafter, various embodiments will be described in detail with reference to the accompanying drawings. The figures are provided to allow those having ordinary skill in the art to understand the scope of the embodiments of the disclosure. Wherever possible, the same reference numbers will be used throughout the drawings to refer to the same or like parts. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1A:
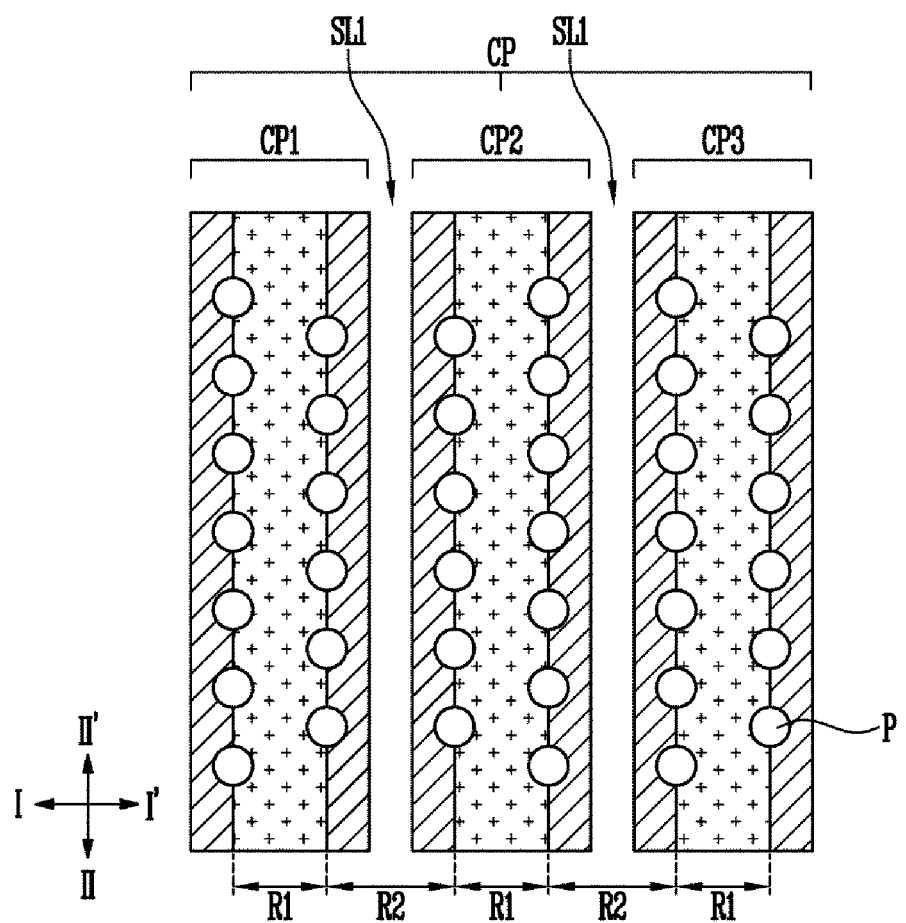
FIGS. 1A and 1B are layout views illustrating a conductive layer according to an embodiment.
Figure 1B:
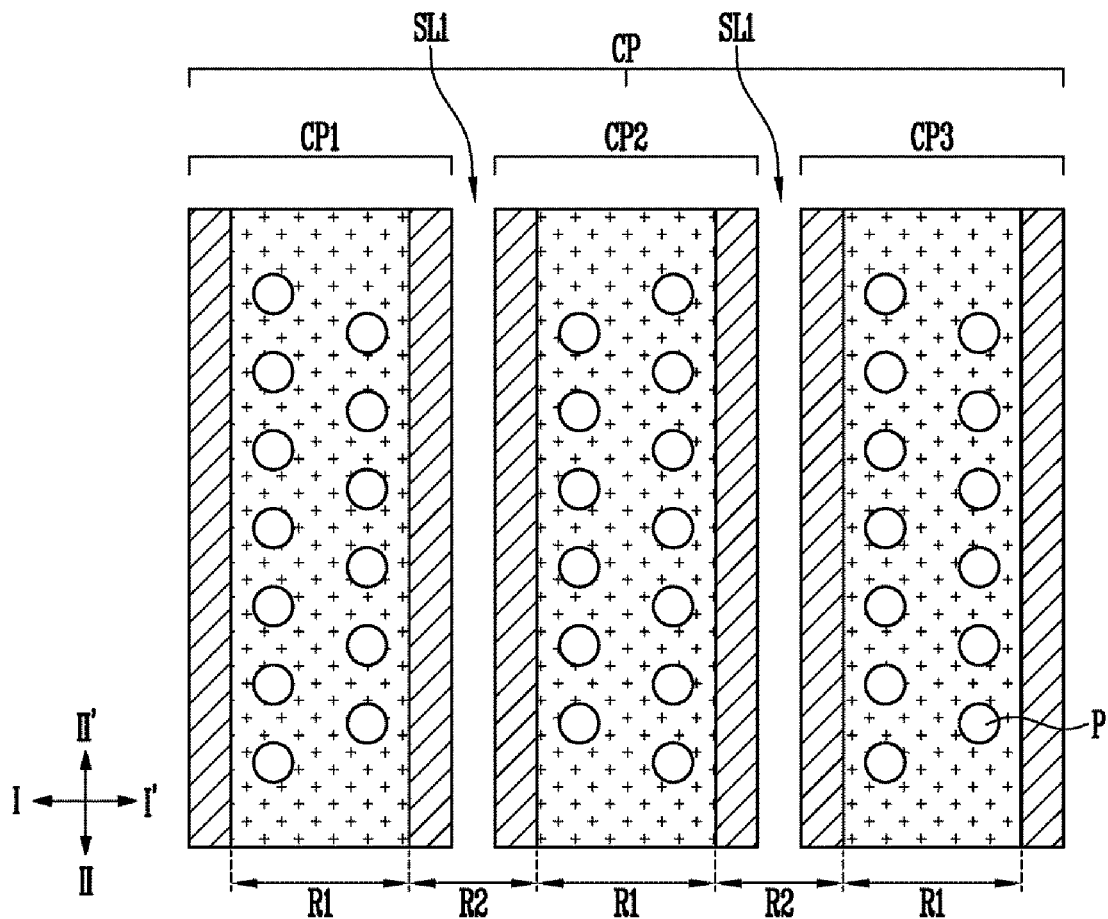

FIGS. 1A and 1B are layout views illustrating a conductive layer according to an embodiment. As shown in FIGS. 1A and 1B, the semiconductor device according to an embodiment may comprise pillars and a plurality of conductive layers CP being stacked while surrounding the pillars.

The pillars P may be arranged in a first direction I-I' and a second direction II-II' crossing the first direction I-I'. Here, the pillars P arranged in the second direction II-II' may form a pillar row. The pillars P may be arranged in a matrix format at regular intervals, in a staggered format as centers of the pillars P have been offset, or in a shape of any combination of the above. Also, when two or more pillars P are coupled by a coupling pattern, the coupling pattern may be arranged in a direction parallel with the first direction I-I' (refer to FIG. 2B) or arranged in a direction having predetermined angle with the first direction I-I'. In FIGS. 1A and 1B, the pillars P are arranged in the staggered format. The pillars P here may be channel layers.

Each of the conductive layers CP may be defined by a plurality of first regions R1 and a plurality of second regions R2, the first regions and the second regions alternating each other. The first region R1 and the second region R2 may have the same width or different widths. Also, different materials may be formed in the first regions R1 and in the second regions R2. Accordingly, the first regions R1 and the second regions R2 may have different structures. For example, the second regions R2 may be formed of materials having lower resistance than the first regions R1.

The semiconductor device may further comprise a plurality of first slits SL1 that pass through the second regions R2 of each of the conductive layers CP. Each of the conductive layers CP may be patterned by the first slits SL1 and separated in a plurality of conductive patterns CP1 to CP3. Each of the conductive patterns CP1 to CP3 may be patterned as a line shape. Here, each of the conductive patterns CP1 to CP3 may include side regions and center regions. The side regions are located at both edge of the conductive patterns CP1 to CP3 and the center regions are located between the side regions. Side regions and the center region of each of the conductive patterns CP1 to CP3 may be formed of different materials. Also, although not shown in the figure, some of the conductive patterns CP1 to CP3 may be coupled to each other at ends.

For example, the conductive layers CP may be used as a word line, a drain selection line, a source selection line, an upper selection line, a lower selection line, etc. Since the second region R2 of the conductive layer CP may have lower resistance compared to the first region R1, a current will flow mainly in the second region.

The second regions R2 may overlap at least some of the plurality of pillars. For example, the second regions R2 may overlap at least some of a plurality of pillar rows, and also, the second regions R2 may be overlapped such that outer surfaces of the overlapped pillars are completely or partially surrounded. FIG. 1A illustrates the second regions R2 overlapping the pillars P. As shown in FIG. 1A, the second regions R2 may overlap the lines of pillars at outermost areas of each of the conductive patterns CP1 to CP3. Also, FIG. 1B illustrates the second regions R2 non-overlapping the pillars P. As shown in FIG. 1B, the second regions R2 may non-overlap the lines of pillars at the outermost areas of each of the conductive patterns CP1 to CP3.

FIGS. 1C to 1G are perspective views illustrating conductive patterns according to an embodiment. Hereinafter, the structures and materials of the conductive patterns will be explained with reference to each figure, but the present invention is not limited thereto, and the conductive patterns may also be formed by combining the embodiments in FIGS. 1C to 1G. Throughout FIGS. 1C to 1G pillars P are illustrated.

Figure 1C:
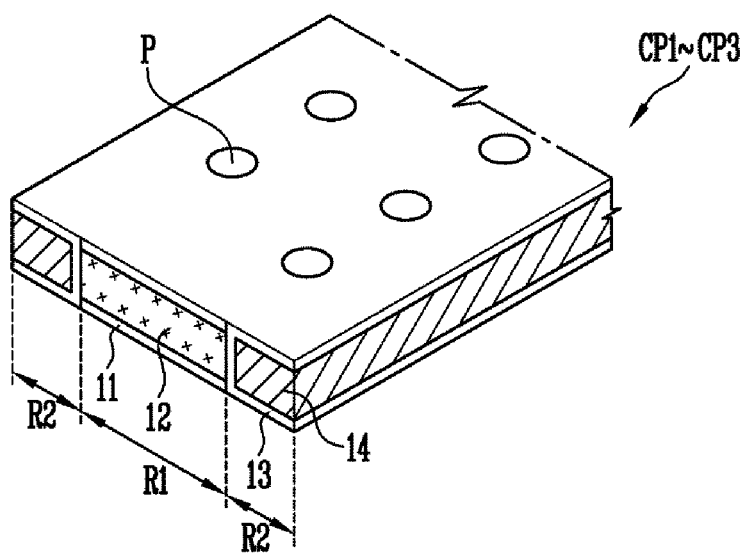
FIGS. 1C to 1G are perspective views illustrating conductive patterns according to an embodiment.

As shown in FIG. 1C, the first region R1 may include a first conductive layer 11 and a non-conductive material layer 12 in the first conductive layer 11. The second region R2 may include a second conductive layer 13 and a third conductive layer 14 in the second conductive layer 13. The second conductive layer 13 may surround an upper surface and a lower surface of the third conductive layer 14 and may be provided between the first conductive layer 11 and the non-conductive material layer 12 and the third conductive layer 14. Although not shown in the figure, the conductive patterns CP1 to CP3 may further include air gaps formed in the non-conductive material layer 12. Also, the second conductive layer 13 may be at least partially formed in the air gap. That is, the second conductive layer 13 may be formed to extend to an inside of the air gap The first and second conductive layers 11 and 13 may be a barrier layer. For instance, the barrier layer may include at least one of a titanium layer, a titanium nitride layer, a tantalum layer or a tantalum nitride layer. The non-conductive material layer 12 may include at least one of an oxide layer, a nitride layer, a silicon oxide layer, a silicon nitride layer, an undoped polysilicon layer, a germanum layer or a silicon germanium layer. The third conductive layer 14 may be a metal layer of low resistance. The third conductive layer 14, for example, may include at least one of a tungsten layer or a tungsten nitride layer.

Figure 1D:
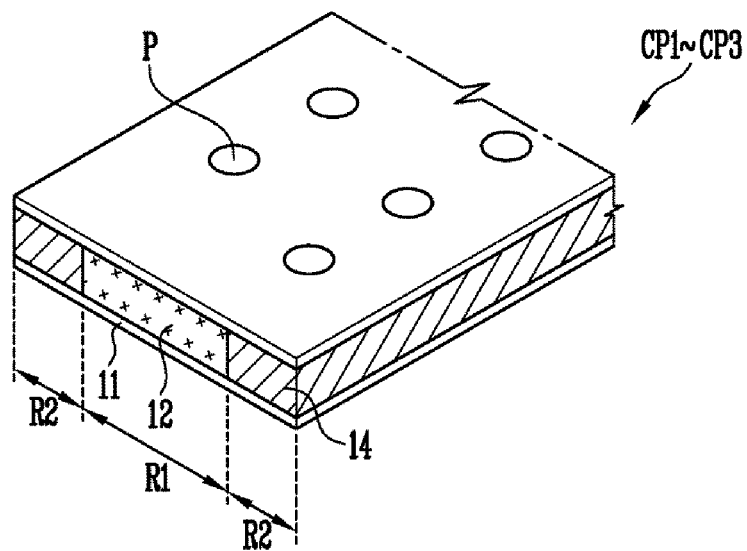

As shown in FIG. 1D, the first region R1 may include the first conductive layer 11 and the non-conductive material layer 12 in the first conductive layer 11. The second region R2 may include the first conductive layer 11 and the third conductive layer 14 in the first conductive layer 11. The first conductive layer 11 may be formed in both the first region R1 and the second region R2. Although not shown in the figure, the conductive patterns CP1 to CP3 may further include the air gaps formed in the non-conductive material layer 12.

Figure 1E:
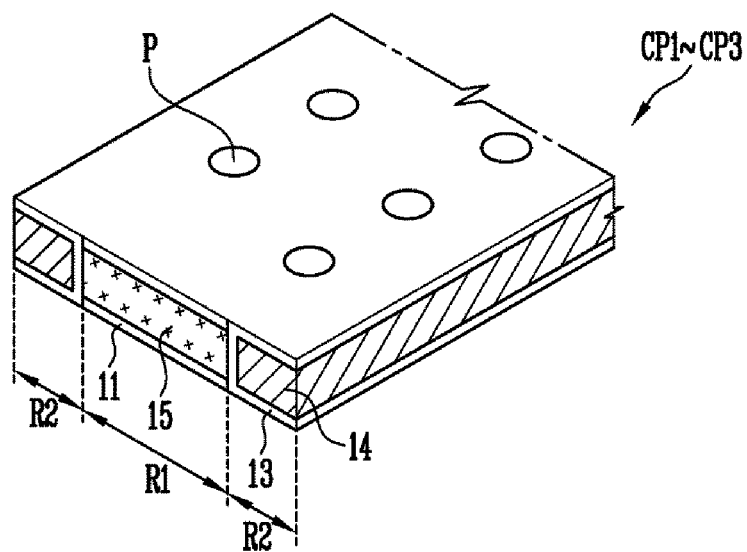

As shown in FIG. 1E, the first region R1 may include the first conductive layer 11 and a fourth conductive layer 15 in the first conductive layer 11. The second region R2 may include the second conductive layer 13 and the third conductive layer 14 in the second conductive layer 13. The fourth conductive layer 15 may be a doped polysilicon layer. Although not shown in the figure, the conductive patterns CP1 to CP3 may further include the air gaps formed in the fourth conductive layer 15.

Figure 1F:
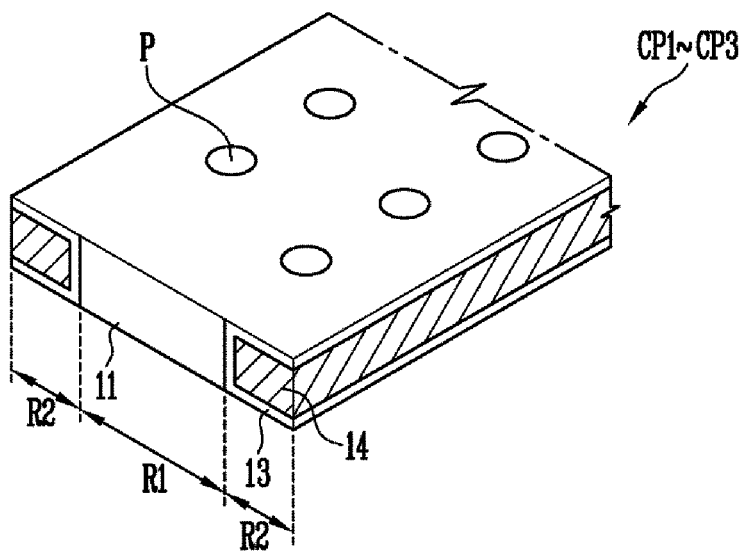

As shown in FIG. 1F, the first region R1 may include the first conductive layer 11, and the second region R2 may include the second conductive layer 13 and the third conductive layer 14 in the second conductive layer 13. The first conductive layer 11 may be formed to completely fill the first region R1. Also, the first conductive layer 11 may be a barrier layer.

Figure 1G:
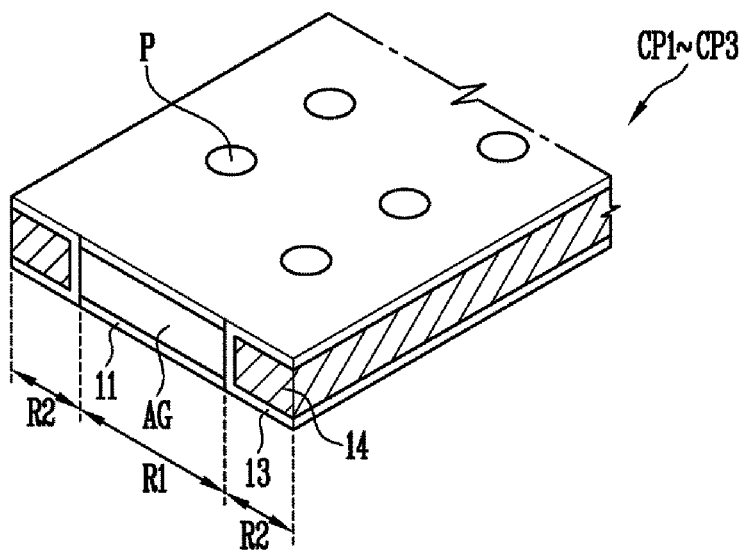

As shown in FIG. 1G, the first region R1 may include the first conductive layer 11 and the air gap within the first conductive layer 11. The second region R2 may include the second conductive layer 13 and the third conductive layer 14 in the second conductive layer 13. Although not shown in the figure, a part of the second conductive layer 13 may be formed in the first conductive layer 11. Here, the air gap may be provided in the second conductive layer 13 of the first region R1.

Figure 2A:
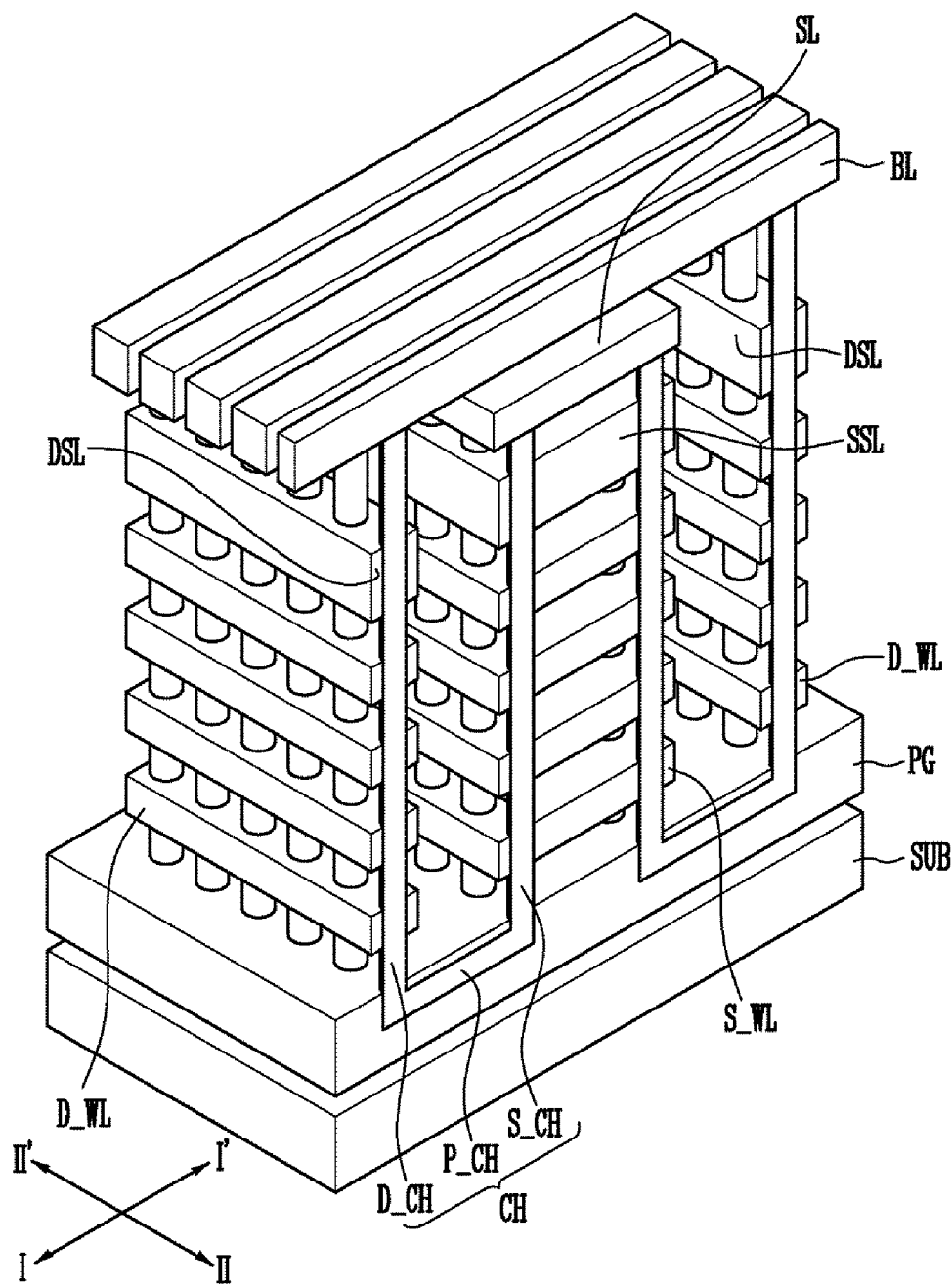
FIGS. 2A and 2B illustrate a structure of a semiconductor device according to an embodiment.

FIG. 2A is a perspective view illustrating a semiconductor device according to an embodiment.

As shown in FIG. 2A, the semiconductor device according to the embodiment may include a pipe gate PG stacked over a substrate SUB, a plurality of drain side word lines D_WL, a plurality of source side word lines S_WL, at least one drain selection line DSL and at least one source selection line SSL.

The semiconductor device may further include U-shaped channel layers CH. The channel layers CH may include a pipe channel layer P_CH formed in the pipe gate PG and source and drain side channel layers S_CH and D_CH coupled to the pipe channel layer P_CH. The figure shows the pipe channel layers P_CH are arranged in a matrix format at regular intervals and parallel with the first direction I-I'.

The plurality of source side word lines S_WL and the at least one source selection line SSL may be stacked while surrounding the channel layers S_CH, and the plurality of drain side word lines D_WL and the at least one drain selection line DSL may be stacked while surrounding the drain side channel layers D_CH. Also, the drain side channel layers D_CH may be coupled to the bit lines BL, and the source side channel layers S_CH may be coupled to the source line SL.

Also, the semiconductor device may further include at least one of a first memory layer (not shown) between the channel layers CH and the word lines D_WL and S_WL while surrounding the channel layer CH or a second memory layer (not shown) between the word lines D_WL and S_WL and the first memory layer (not shown) while surrounding the word lines D_WL and S_WL.

At a location where the source side channel layer S_CH and the source selection line SSL intersect with each other, a source selection transistor may be formed. At a location where the source side channel layer S_CH and the source side word line S_WL intersect with each other, a source side memory cell may be formed. At a location where the pipe channel layer P_CH and the pipe gate PG intersect with each other, a pipe transistor may be formed. At a location where the drain side channel layer D_CH and the drain selection line DSL intersect with each other, a drain selection transistor may be formed. At a location where the drain side channel layer D_CH and the drain side word line D_WL intersect with each other, a drain side memory cell may be formed.

Accordingly, at least one drain selection transistor, the plurality of drain side memory cells, pipe transistors, the plurality of source side memory cells and at least one source selection transistor, coupled in series, form one string, and the strings are arranged in U shapes.

Figure 2B:
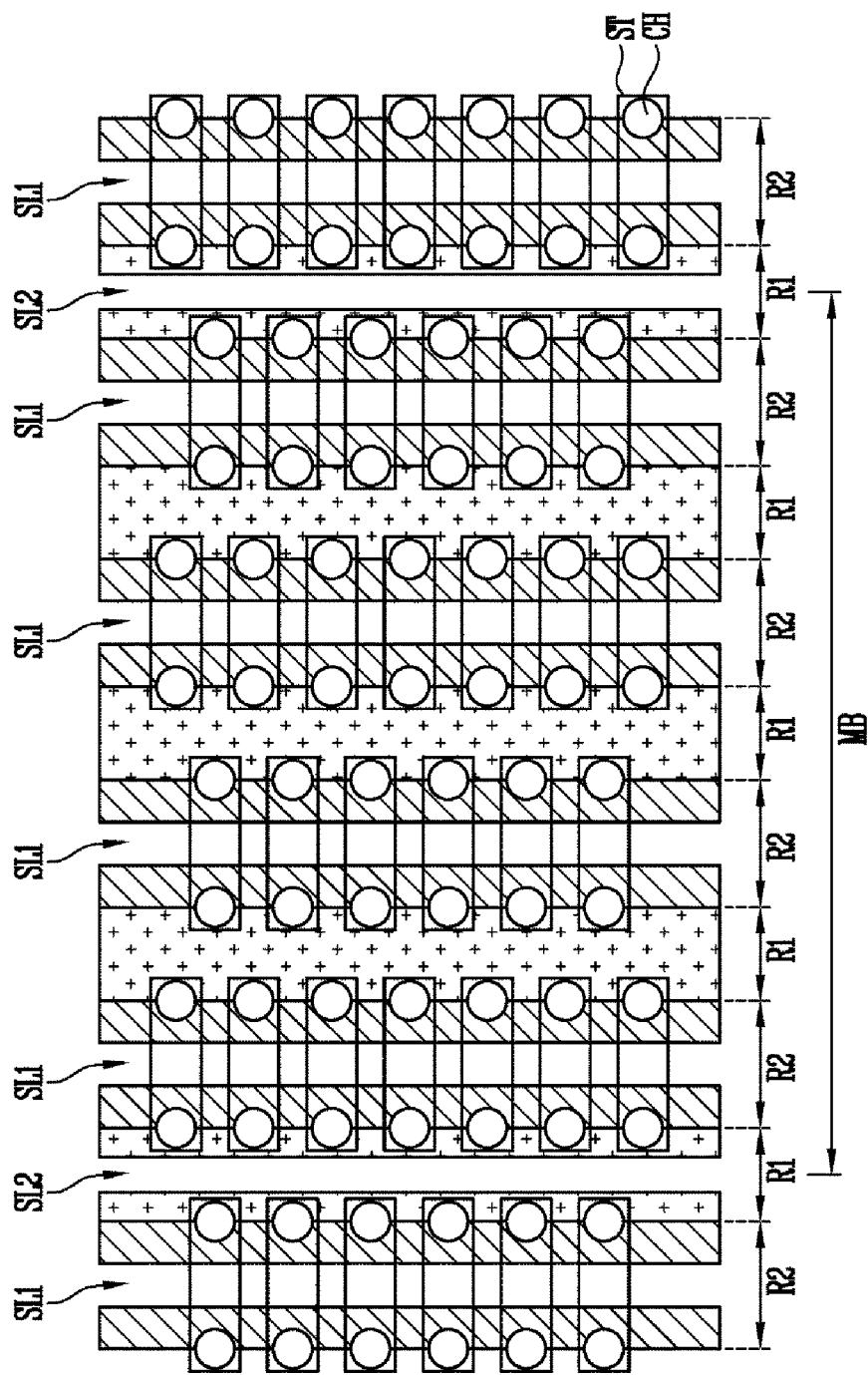

FIG. 2B is a layout view illustrating the conductive layer included in a semiconductor device according to an embodiment. The figure may also be a layout view illustrating the source side word line S_WL, the drain side word line D_WL, and the source selection line SSL or the drain selection line DSL.

As shown in FIG. 2B, the conductive layer is defined by the plurality of first regions R1 and the plurality of second regions R2, the first regions R1 and the second regions R2 alternating each other. Also, the conductive layer may be patterned by the plurality of first slits SL1 that pass through the conductive layer.

For example, as for the source side word line S_WL and the drain side word line D_WL, the first slits SL1 may be arranged in a zigzag pattern so that ends of the first slits SL1 are coupled to each other. In this case, the source side word lines S_WL formed in the same level may be coupled to each other on one end, and the drain side word lines D_WL formed in the same level may be coupled on the other end. In other examples, regarding the source selection line SSL and the drain selection line DSL, the conductive layer may be patterned into a linear shape by the first slits SL1.

The first slits SL1 may pass through the second regions R2 of the conductive layer. In particular, the first slits SL1 may be provided between the source side channel layer S_CH and the drain side channel layer D_CH, which form one string ST. That is, the first slits SL1 may be provided between the source side channel layer S_CH and the drain side channel layer D_CH coupled by one pipe channel layer P_CH.

Also, the semiconductor device may further include the plurality of second slits SL2 provided between neighboring memory blocks MB. The second slits SL2 may pass through the first regions R1 of the conductive layer and pattern the conductive layer. The second slits SL2 may be provided between the neighboring strings ST.

The figure shows the channel layers CH as centers of the channel layers CH have been offset.

FIGS. 3A to 3G are cross-sectional views illustrating a method of manufacturing the semiconductor device described above with reference to FIGS. 2A and 2B.

Figure 3A:
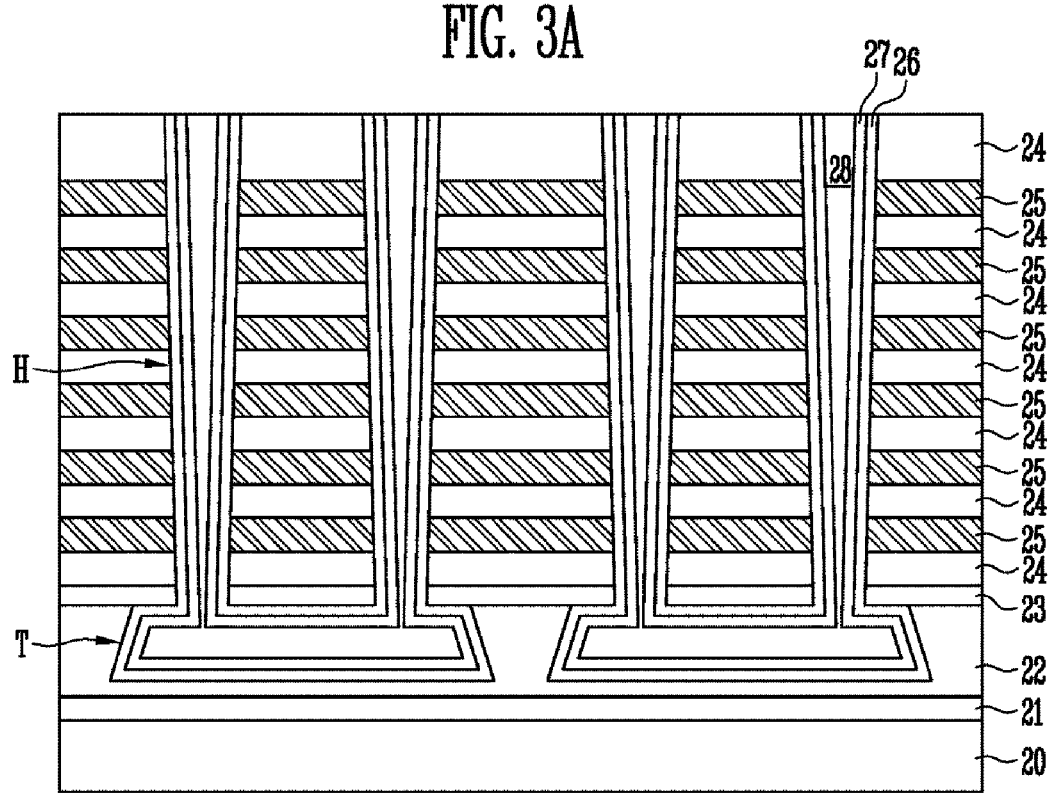
FIGS. 3A to 3G are process flowcharts illustrating a method of manufacturing a semiconductor device according to an embodiment.

As shown in FIG. 3A, a conductive layer 22 for a pipe gate may be formed over an interlayer insulating layer 21 after the interlayer insulating layer 21 is formed over the substrate 20. After trenches T are formed in the conductive layer 22, sacrificial layers (not shown) may be formed in the trenches T. A protective layer 23 may be further formed over the conductive layer 22 where the sacrificial layers are formed. The protective layer 23 may be formed of a conductive material layer.

A plurality of first material layers 25 and a plurality of second material layers 24 may be alternately formed over the protective layer 23. The first material layer 25 and the second material layer 24 may be formed of a material having a great etch selectivity to each other. The first material layer 25 may be formed of a sacrificial layer such as a nitride layer, etc., and the second material layer 24 may be formed of an insulating layer such as an oxide layer, etc. Also, the first material layer 25 may be formed of a first sacrificial layer, and the second material layer 24 may be formed of a second sacrificial layer. In the embodiments, the first material layer 25 is formed of a sacrificial layer, and the second material layer 24 is formed of an insulating layer.

A plurality of holes H passing through the plurality of the first and second material layers 25 and 24 may be formed. The holes H may be formed where the holes H are coupled to the trenches T. For example, for one trench T, there may be a pair of the holes H coupled to the one trench T, and accordingly, the plurality of holes H are formed.

After the sacrificial layers are removed through the holes H, a coupling pattern located in the trenches T and pillars located in the holes H may be formed. The pillars may be formed such that the pillars have center regions that are open or filled to the center, or the pillars may be formed in any combination thereof. When the pillars includes the center regions that are open, the insulating layer 28 may be formed in the open center regions.

In an embodiment, the first memory layer 26 and the channel layer 27 may be sequentially formed in the trenches T and the holes H. The first memory layer 26 may include at least one of a charge blocking layer, a data storage layer or a tunnel insulating layer. The data storage layer may include at least one of a floating gate such as a polysilicon layer, etc. that saves a charge, a charge trap layer such as a nitride layer, etc. that traps a charge or a nano dot. Also, the channel layer 27 may include the pipe channel layer, the source side channel layer and the drain side channel layer, where the source side channel layer and the drain side channel layer are coupled to the pipe channel layer. The channel layer 27 may be formed such that the channel layer 27 has a center region that is open or is filled to the center, or the channel layer 27 may be formed in any combination thereof. When the channel layer 27 includes the center region that is open, the insulating layer 28 may be formed in the open center region.

In other embodiments, a gate insulating layer, a channel layer and a phase change material layer may be sequentially formed in the trenches T and the holes H. The phase change material layer may be formed such that the phase change material layer has a center region that is open or is filled to the center, or the phase change material layer may be formed in any combination thereof. When the phase change material layer includes the center region that is open, the insulating layer may be formed in the open center region.

Figure 3B:
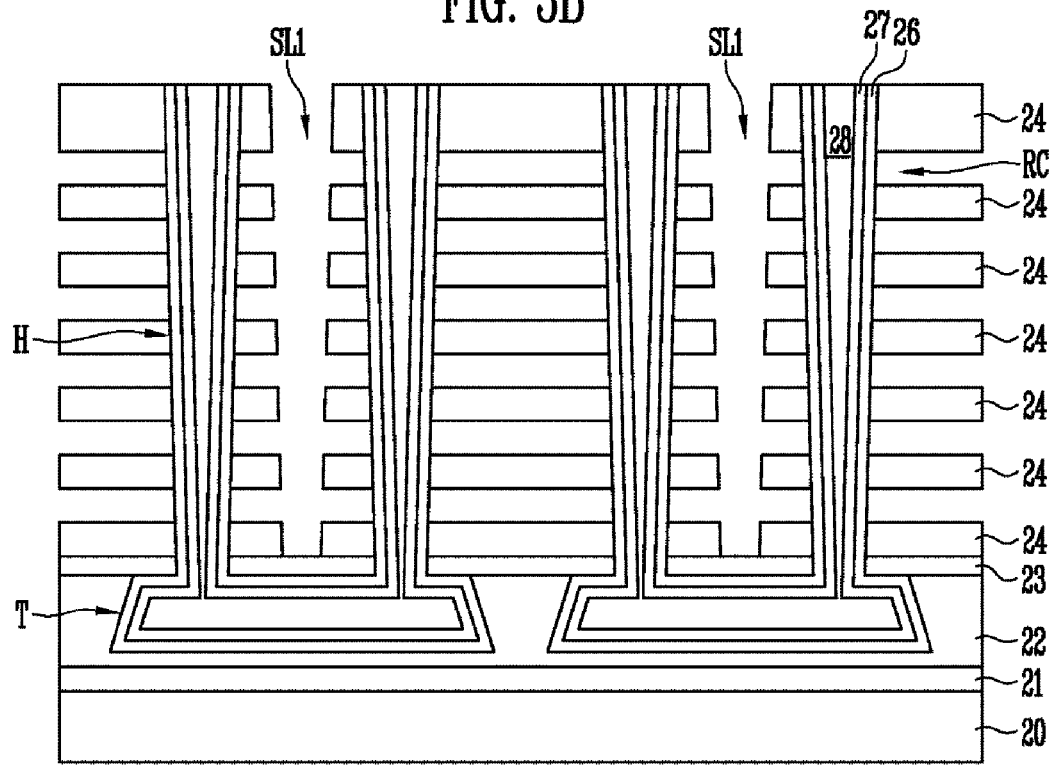

As shown in FIG. 3B, the plurality of first slits SL1 may be formed which pass through the plurality of the first and second material layers 25 and 24. The first slits SL1 may be provided between the pillars coupled by the one coupling pattern. Also, the first slits SL1 may be formed by an etching process using the protective layer 23 as an etch stop layer.

Recess regions RC may be formed by selectively removing the first material layers 25 exposed in the first slits SL1.

Before forming the first slits SL1, a process for forming the plurality of second slits SL2 (refer to FIG. 2B) provided at a boundary of the neighboring memory blocks may be further performed. The insulating layer may be formed in the second slits SL2. In this case, since the insulating layer in the second slits SL2 may be used as a supporter when forming the recess regions RC, slanting or collapsing of the second material layers 24 that remain may be prevented.

Figure 3C:
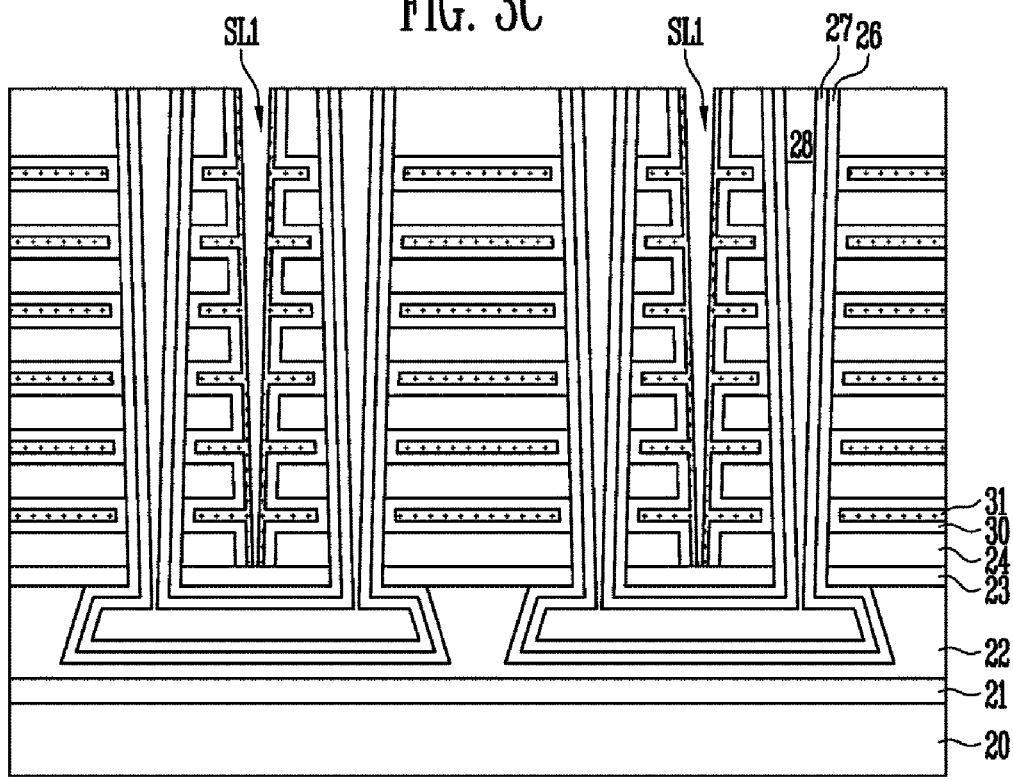

As shown in FIG. 3C, after the first conductive layer 30 is formed in the recess regions RC through the first slits SL1, the non-conductive material layer 31 may be formed in the first conductive layer 30. The first conductive layer 30 and the non-conductive material layer 31 may be sequentially formed in the recess regions RC. Here, by adjusting the deposition thickness of the non-conductive material layer 31, the recess regions RC may be completely filled with the non-conductive material layer 31 or the air gap may be formed in the non-conductive material layer 31. The further a region is separated from the first slits SL1, the more likely it is that the non-conductive material layer 31 is not completely filled in the recess regions RC and the air gap is formed.

A reaction gas may partially remain in the air gap that was used in forming the non-conductive material layer 31. The reaction gas does not damage peripheral layers due to characteristics of a material. Therefore, even though the reaction gas may remain in the air gap, the characteristics of the device are not deteriorated.

Since the first conductive layer 30, the non-conductive material layer 31, etc. may be formed in the recess regions RC using a process of a deposition method, the first conductive layer 30, the non-conductive material layer 31, etc. may be formed in the first slits SL1.

Although not shown in the drawings, the second memory layer may be further formed before forming the first conductive layer 30. The second memory layer may include at least one of a tunnel insulating layer, a data storage layer or a charge blocking layer. The data storage layer may include at least one of a floating gate such as a polysilicon layer storing a charge, etc., a charge trap layer such as a nitride layer that traps a charge, etc., or a nano dot.

Figure 3D:
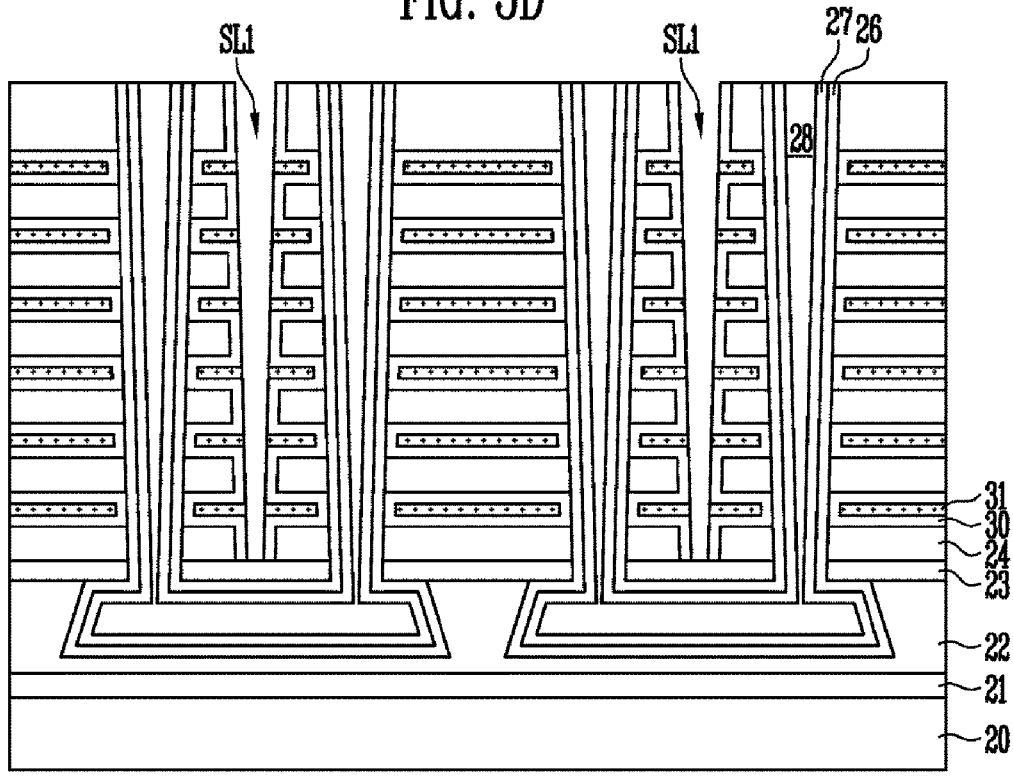

As shown in FIG. 3D, the non-conductive material layers 31 formed in the first slits SL1 may be selectively removed. For example, the non-conductive material layer 31 may be etched using an etching process.

Figure 3E:
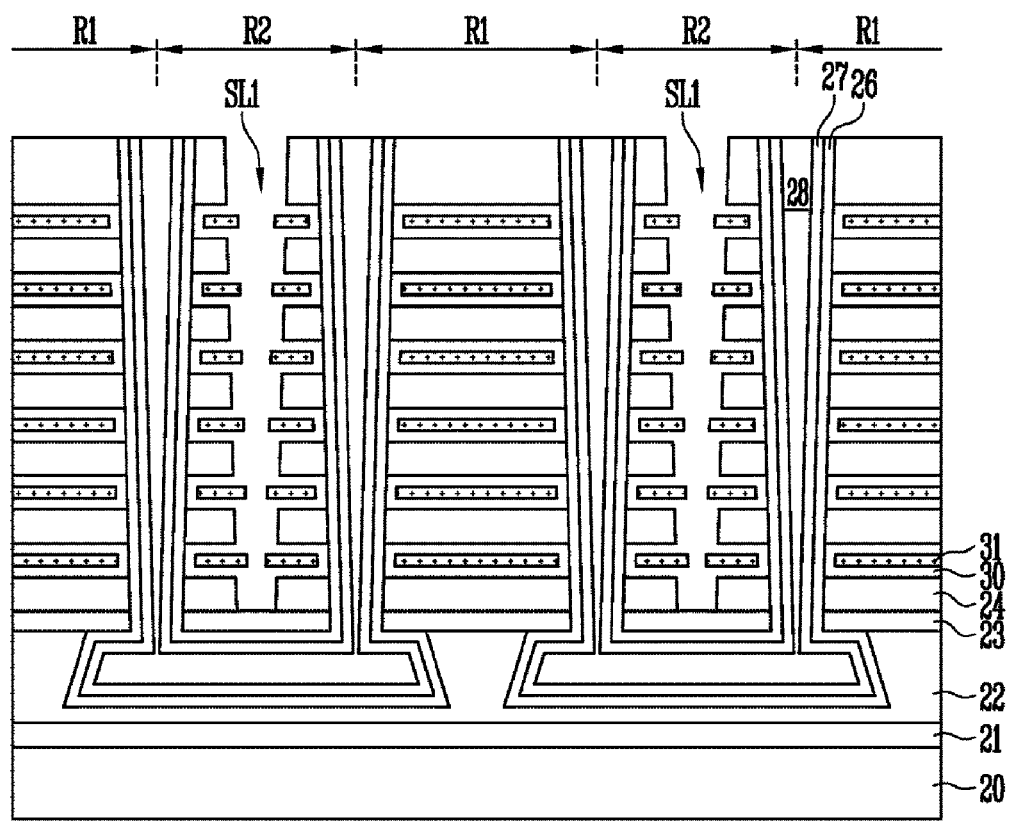

As shown in FIG. 3E, the first conductive layers 30 exposed in the first slits SL1 are selectively removed. Here, by adjusting the etching process conditions, how deep the first conductive layer 30 is to be etched may be adjusted. Depending on how deep the first conductive layer 30 is etched, the first memory layer 26 may be exposed or not exposed.

The region from which the first conductive layer 30 is removed is defined as the second regions R2 as described above with reference to FIG. 2B. The region where the first conductive layer 30 remains is defined by the first regions R1. Although the non-conductive material layers 31 in the second regions R2 are shown to be floating in the air in the figure, the non-conductive material layers 31 of the second regions R2 are coupled to the non-conductive material layers 31 of the first regions R1 through space between the holes H.

Figure 3F:
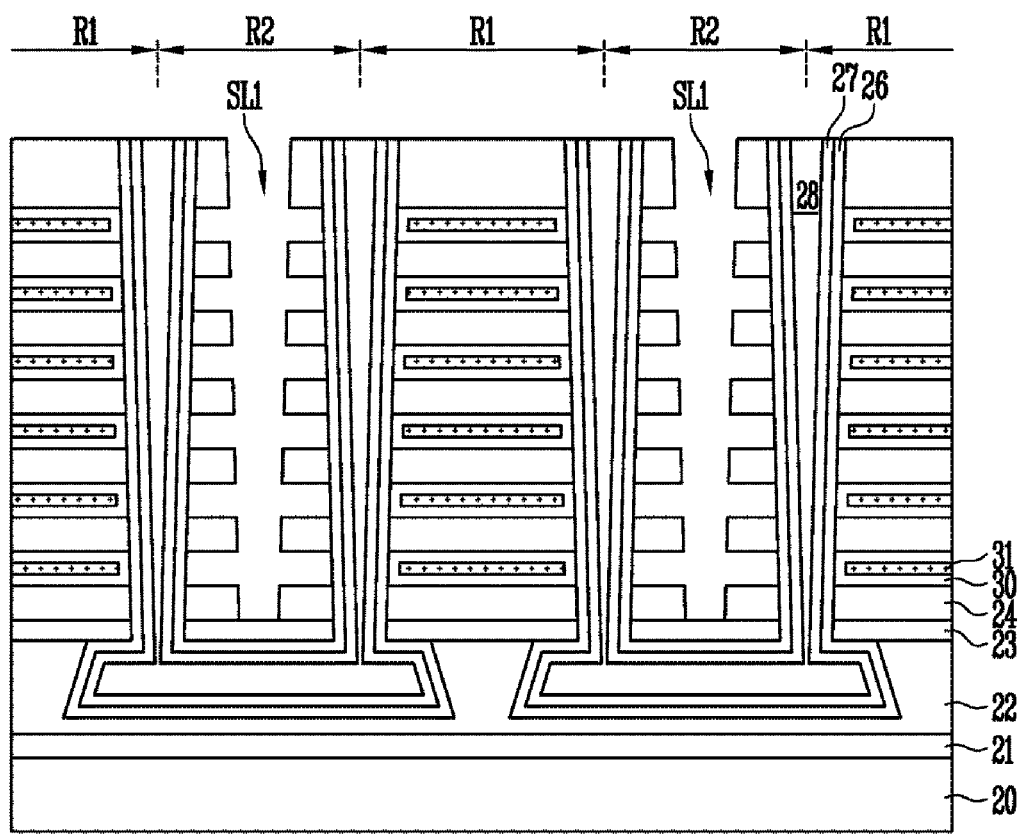

As shown in FIG. 3F, the non-conductive material layers 31 exposed in the first slits SL1 may be selectively removed. Here, by adjusting the etching process conditions, how deep the non-conductive material layer 31 is to be etched may be adjusted. For example, the non-conductive material layer 31 may be etched using a wet etching process. The non-conductive material layer 31 that protrudes compared to the first conductive layer 30 that remains may be etched.

If the non-conductive material layers 31 are formed of a material having a great etch selectivity with respect to the second material layers 24, the non-conductive material layers 31 may be selectively etched using the etch selectivity between the two materials. If the etch selectivity between the non-conductive material layers 31 and the second material layers 24 is not sufficiently great, the non-conductive material layers 31 may be selectively etched in a state in which the second material layers 24 are protected by the second memory layers.

Accordingly, the first conductive layers 30 and the non-conductive material layers 31 in the second regions R2 are all removed, forming empty space.

Figure 3G:
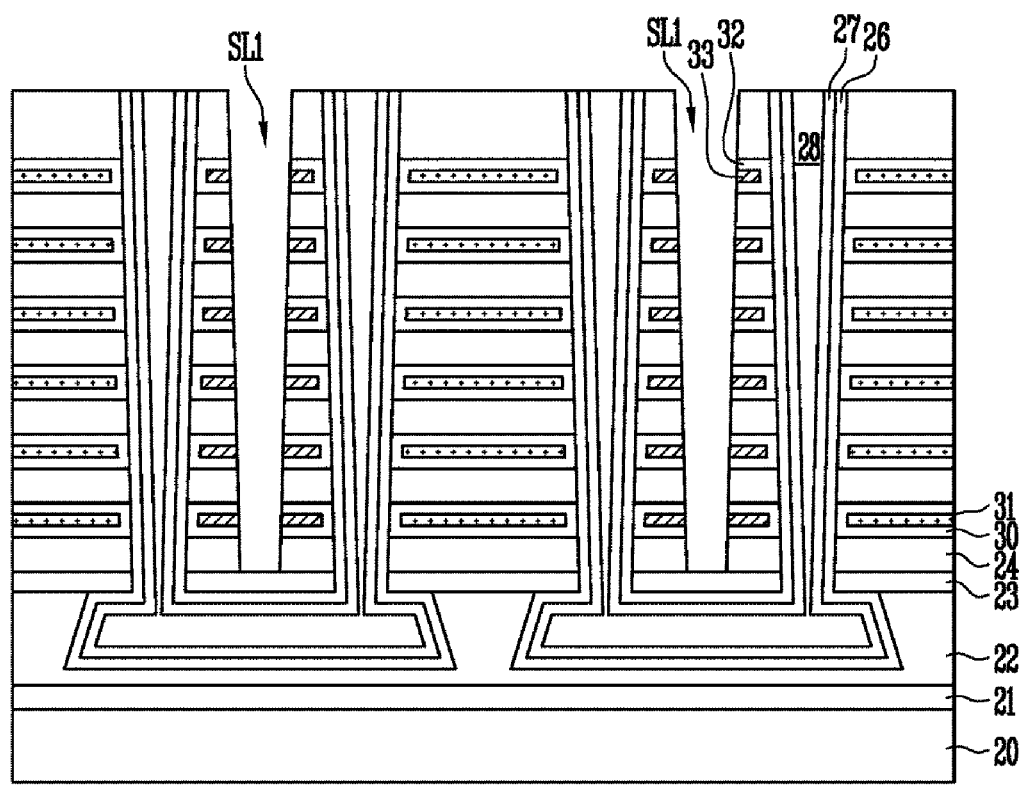

As shown in FIG. 3G, after the second conductive layers 32 are formed in the second regions R2, the third conductive layers 33 may be formed in the second conductive layers 32.

When the second and third conductive layers 32 and 33 are formed in the first slits SL1, the conductive layers of each level are separated by removing the second and third conductive layers 32 and 33 formed in the first slits SL1. Thus, a plurality of conductive layers are formed where the first regions R1 and the second regions R2 are alternately arranged. Especially, each of the conductive layers, as described above with respect to FIG. 1C, may include the plurality of the first regions R1 including the first conductive layers 30 and the non-conductive material layers 31 and the plurality of second regions R2 including the second and third conductive layers 32 and 33.

Although not shown in the figure, an insulating layer is formed in the first slits SL1. Here, it may be possible to form the air gap in the first slits SL by adjusting the deposition conditions of the insulating layer.

Additionally, when the first material layers 25 are formed with the first sacrificial layers and the second material layers 24 are formed with the second sacrificial layers, the recess regions may be additionally formed by removing the second material layers 24 exposed in the first slits SL1, and the process for etching the first memory layers 26 exposed in the recess regions may be additionally conducted. Retention characteristics may be enhanced by separating the data storage layer of the stacked memory cells. The corresponding process may be performed before the first material layers 25 are removed, or may be performed before the insulating layer is formed in the first slits SL1.

The manufacturing method described above may be modified in part, and conductive patterns having various structures may be formed as a result. For example, instead of forming the non-conductive material layers 31 in the first conductive layers 30, it may be possible to form fourth conductive layers such as doped polysilicon layers, etc. In this case, the conductive patterns shown in FIG. 1E may be formed. Also, instead of forming the non-conductive material layers 31 in the first conductive layers 30, the recess regions RC may be completely filled with the first conductive layers 30. In this case, the conductive patterns having the structure shown in FIG. 1F may be formed.

Figure 4A:
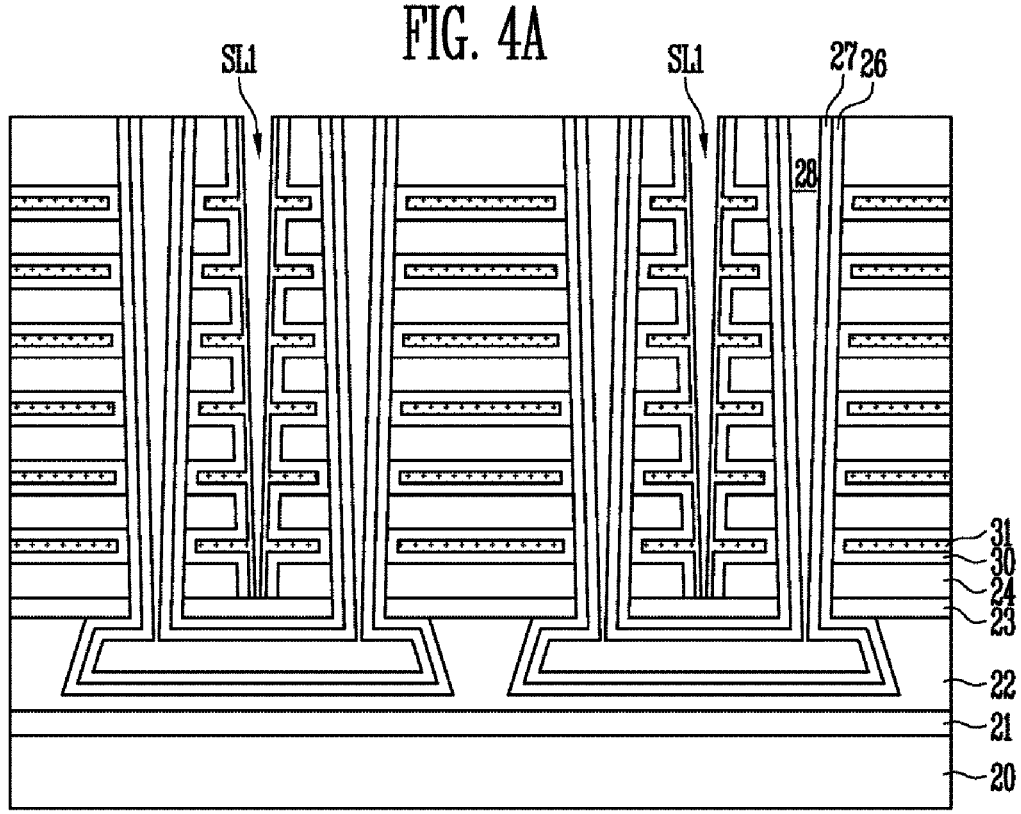
FIGS. 4A to 4C are process flowcharts illustrating a method of manufacturing a semiconductor device according to an embodiment.
Figure 4B:
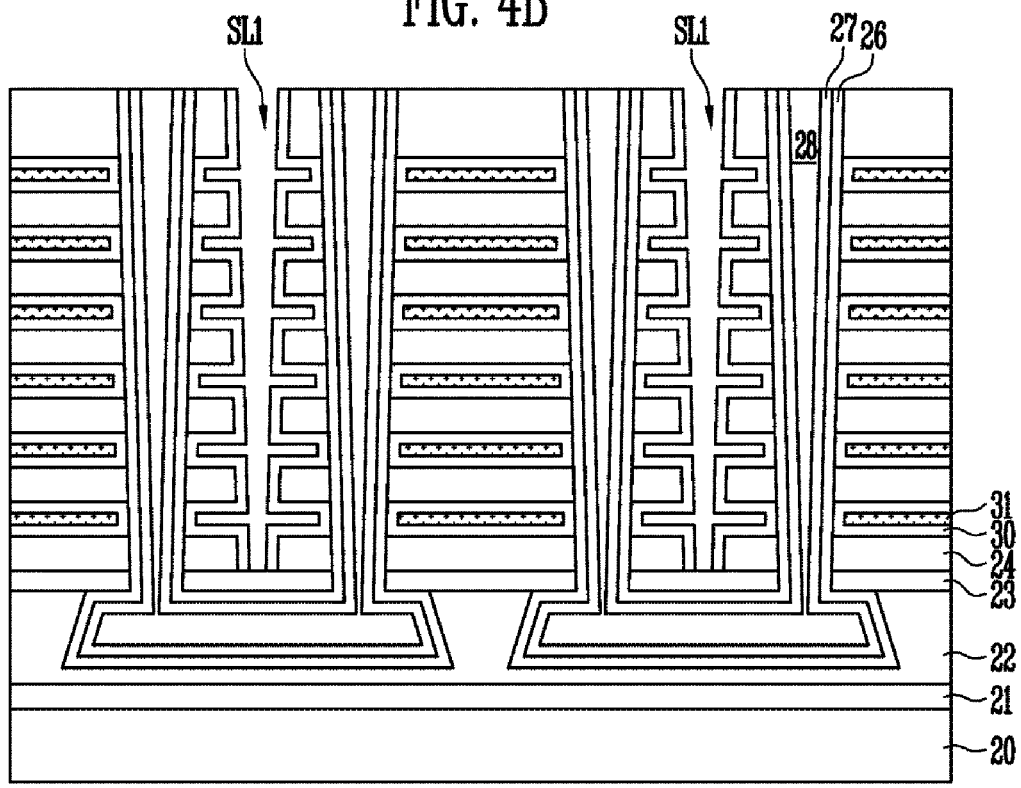
Figure 4C:
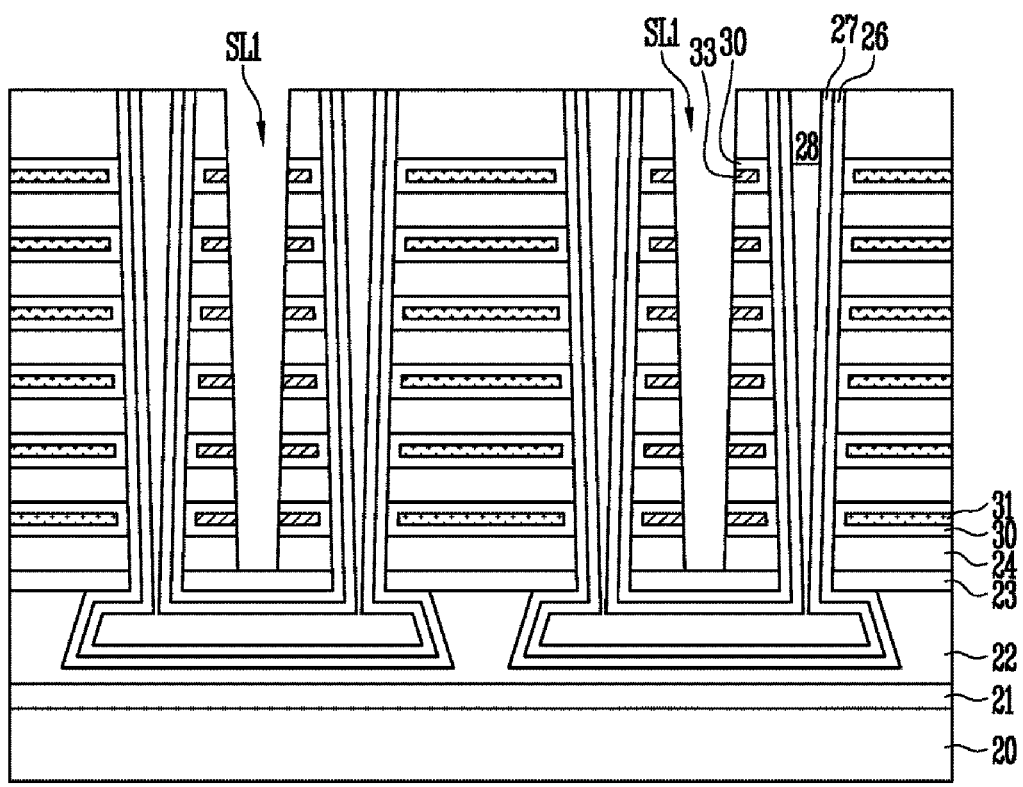

FIGS. 4A to 4C illustrate a method of manufacturing a semiconductor device described above with reference to FIGS. 2a and 2b.

FIG. 4A corresponds to FIG. 3C described above, and processes up to the process of forming the first conductive layers 30 and the non-conductive material layers 31 may be performed in the same way as in the embodiment described above.

As shown in FIG. 4B, the non-conductive material layers 31 exposed in the first slits SL1 may be selectively removed. Here, the non-conductive material layers 31 formed in the first slits SL1 and in the recess regions adjacent to the first slits SL1 may be etched.

Regions from where the non-conductive material layers 31 are removed are defined as the second regions R2 described above with reference to FIG. 2B. Also, regions where the non-conductive material layers 31 remain are defined as the first regions R1.

As shown in FIG. 4C, the third conductive layers 33 may be formed in the second regions R2. When the first and third conductive layers 30 and 33 are formed in the first slits SL1, the conductive layers on each level are separated by removing the first and third conductive layers 30 and 33 formed in the first slits SL1. There may be formed the plurality of conductive layers where the first regions R1 and the second regions R2 are alternately arranged. Particularly, each of the conductive layers, as described above with reference to FIG. 1D, may include the plurality of first regions R1 including the first conductive layers 30 and the non-conductive material layers 31 and the plurality of second regions R2 including the first and third conductive layers 30 and 33.

Figure 5A:
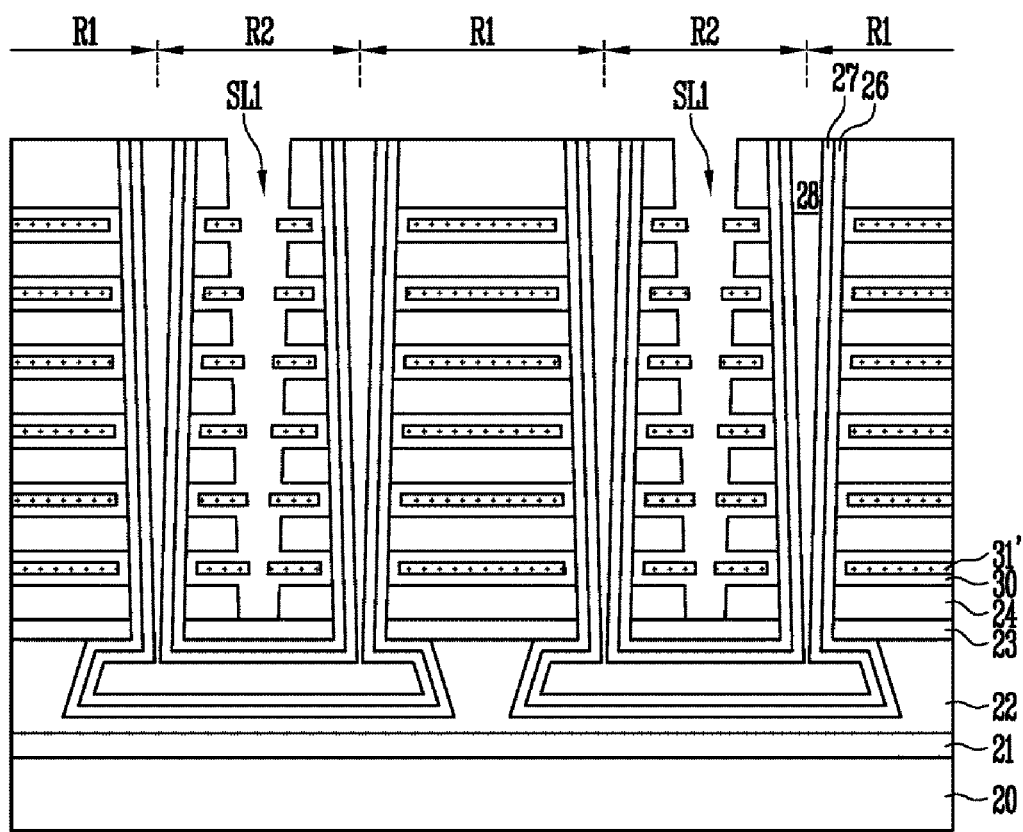
FIGS. 5A to 5C illustrate a method of manufacturing a semiconductor device according to an embodiment.
Figure 5B:
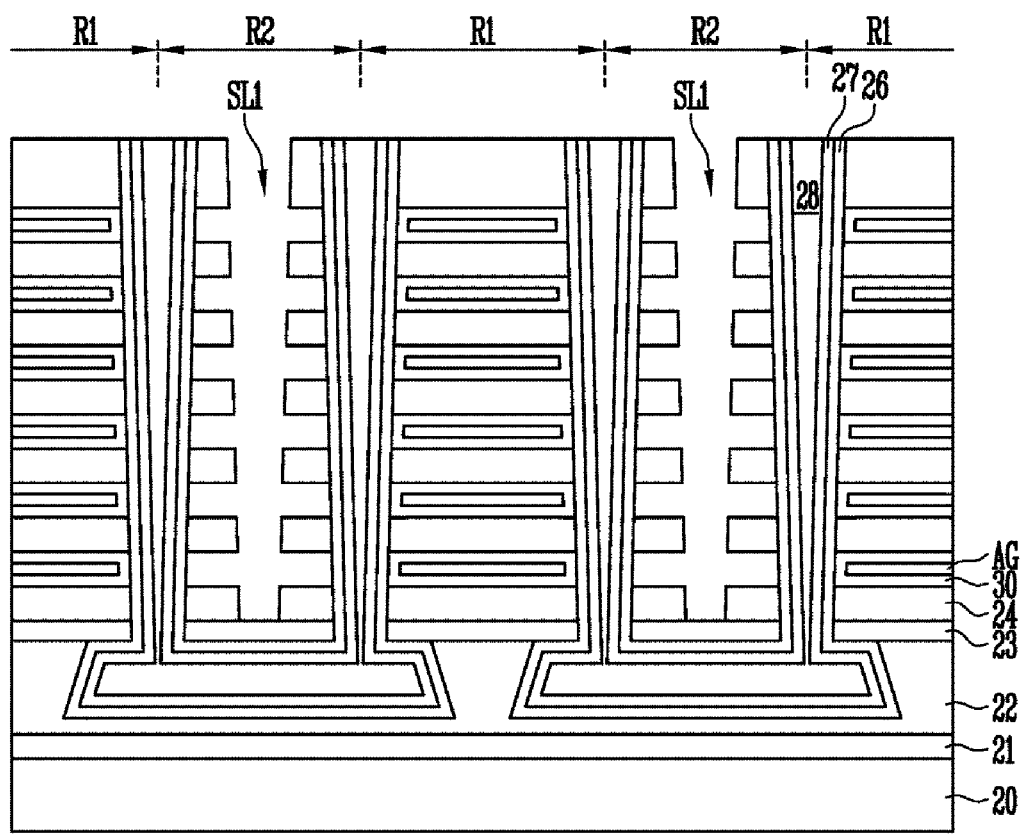
Figure 5C:
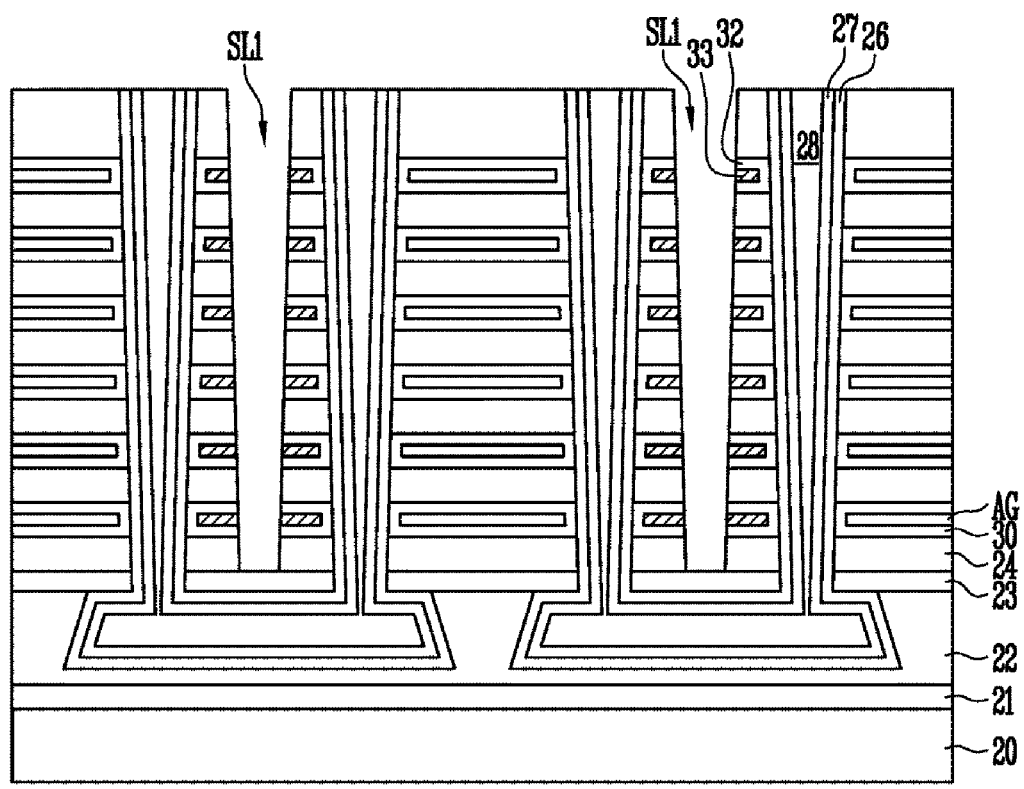

FIGS. 5A to 5C illustrate a method of manufacturing a semiconductor device described above with reference to FIGS. 2A and 2B.

FIG. 5A corresponds to FIG. 3E described above. In this embodiment, sacrificial layers 31' are formed instead of the non-conductive material layers 31 in the first conductive layers 30. Here, the sacrificial layer 31' is formed of a material having a great etch selectivity with respect to the first conductive layer 30. All others up to the process for selectively removing the first conductive layers 30 exposed in the first slits SL1 are performed in the same way as in the embodiment described above.

As shown in FIG. 5B, the sacrificial layers 31' exposed in the first slits SL1 may be selectively removed. By adjusting the etching process conditions such as the process time, etchant concentration, etc., the depth as to how deep the sacrificial layer 31' is to be etched may be adjusted. For example, the sacrificial layers 31' may be etched using a wet etching process such that the sacrificial layers 31' formed not only in the second regions R2 but also in the first regions R1 may be removed. Accordingly, the air gaps AG may be formed in the first conductive layers 30 of the first regions R1.

As shown in FIG. 5C, the second conductive layers 32 are formed in the second regions R2. The air gaps AG of the first regions R1 are isolated as the space between the channel layers 27 is filled with the second conductive layers 32. A part of the second conductive layer 32 may be formed in the air gap AG in the process of forming the second conductive layer 32 in the second region R2. Thereafter, the third conductive layer 33 may be formed in the second conductive layer 32.

There may be formed the plurality of conductive layers where the first regions R1 and the second regions R2 are alternately arranged. Particularly, each of the conductive layers, as described above with reference to FIG. 1G, may include the plurality of first regions R1 including the first conductive layers 30 and the air gaps AG and the plurality of second regions R2 including the second and third conductive layer 32 and 33.

Figure 6A:
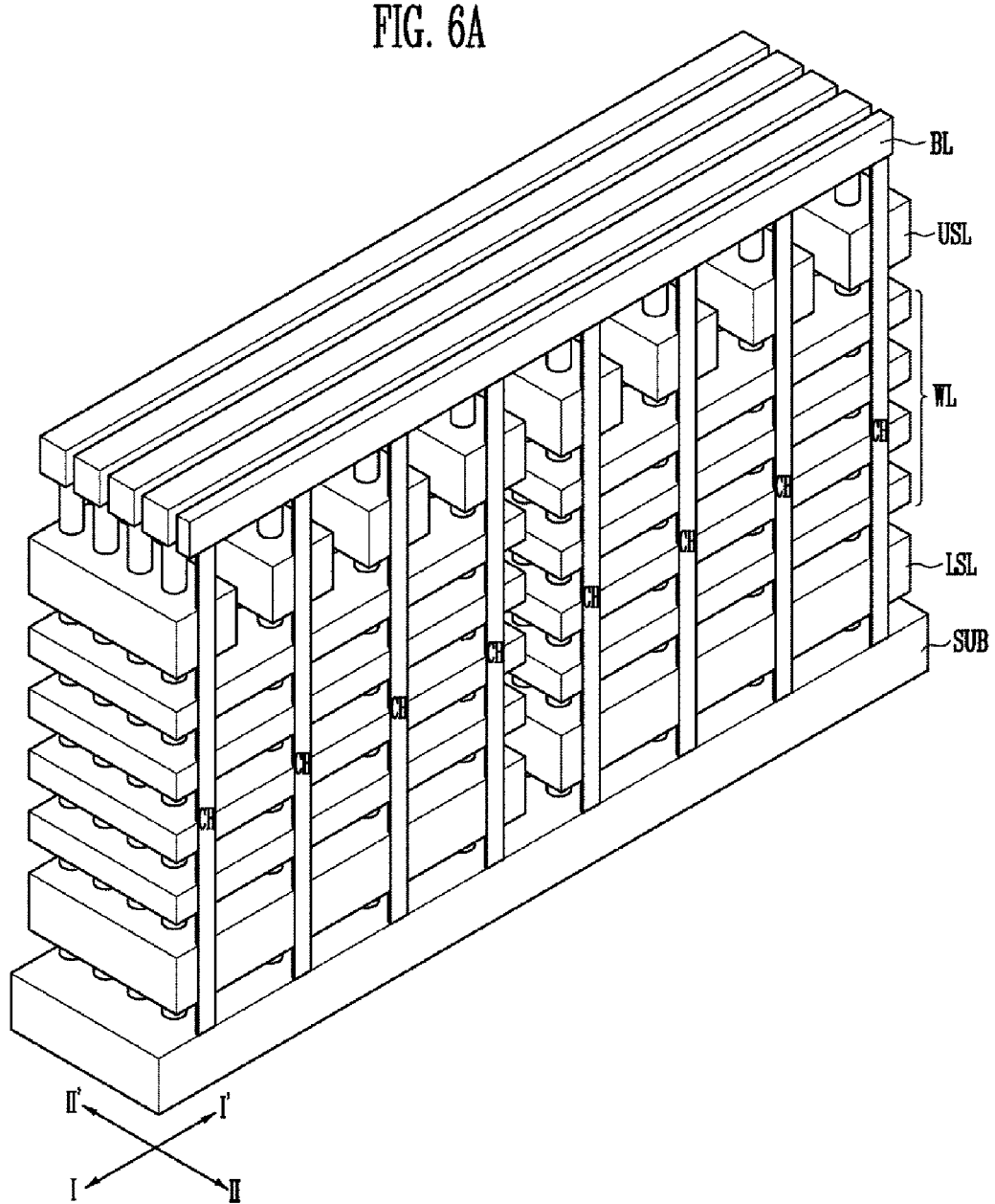
FIGS. 6A to 6C illustrate a semiconductor device and a method of the same according to an embodiment.

FIG. 6A is a perspective view illustrating a semiconductor device according to an embodiment. As shown in FIG. 6A, the semiconductor device according to the embodiments may include the channel layers CH protruding from the substrate SUB. The figure shows the channel layers CH arranged in a matrix format at regular intervals.

The semiconductor device further comprises at least one of the lower selection lines LSL stacked while surrounding the channel layers CH, the plurality of word lines WL and at least one of the upper selection lines USL. For example, the upper selection lines USL may be formed to surround one row of the pillars, and the plurality of word lines WL and the lower selection lines LSL may be formed to surround at least two rows of the pillars. This figure shows the plurality of word lines and the lower selection lines LSL surrounding four rows of the pillars.

The semiconductor device further includes bit lines BL coupled to upper portions of the channel layers CH and source layers (not shown) coupled to lower portions of the channel layers CH. Here, the source layer may be formed by doping impurities to the substrate SUB.

Also, the semiconductor device may further include at least one of the first memory layer (not shown) between the channel layer CH and the word lines WL and the second memory layer (not shown) between the word lines WL and the first memory layer (not shown) while surrounding the word lines WL.

In this structure, a lower selection transistor is formed at a location where the channel layer CH and the lower selection line LSL intersect with each other, a memory cell is formed at a location where the channel layer CH and the word line WL intersect with each other, and an upper selection transistor is formed at a location where the channel layer CH and the upper selection line USL intersect with each other. Accordingly, at least one of the lower selection transistors coupled in series, a plurality of memory cells and at least one of the upper selection transistors form one string, and the strings are arranged vertically.

Figure 6B:
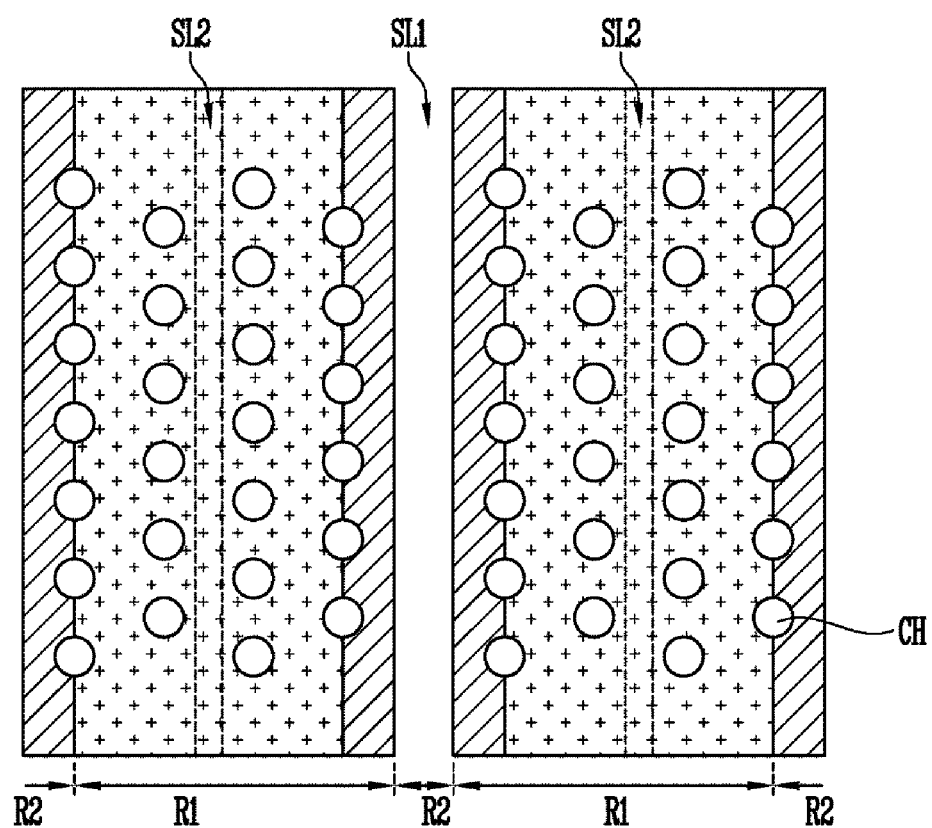

FIG. 6B is a layout view illustrating a conductive layer included in a semiconductor device according to an embodiment. This figure also may be a lay out of, for example, the lower selection line LSL, the word line WL or the upper selection line USL (See FIG. 6A).

As shown in FIG. 6B, the conductive layer may be defined by the plurality of first regions R1 and the plurality of second regions R2, the first regions R1 and the second regions R2 alternating each other. Also, the conductive layer is patterned by at least one of the first slits SL1 that pass through the conductive layer. The first slit SL1 passes through the second region R2. For example, the word lines WL are patterned in units of a memory block by the first slits SL1 while surrounding two or more rows of the pillars.

The semiconductor device may further include the plurality of second slits SL2 between the neighboring pillar rows. The second slits SL2 are for patterning at least one layer of the conductive layers at a top part, for example, the upper selection line USL into a linear shape. The second slits SL2 may be provided at all of locations between the neighboring pillar rows or some of the locations between the neighboring pillar rows. This figure shows the channel layers CH as centers of the channel layers CH have been offset. In this case, since the neighboring pillar rows may share the upper selection line USL, the second slits SL2 may be provided at some of the locations between the neighboring pillar rows. As shown in FIG. 6A, if, however, the channel layers CH are arranged in a matrix format at regular intervals, the second slits SL2 may be located at all locations between the neighboring pillar rows.

Although not shown in this figure, the semiconductor device may further include a plurality of third slits provided between the neighboring memory blocks MB.

Figure 6C:
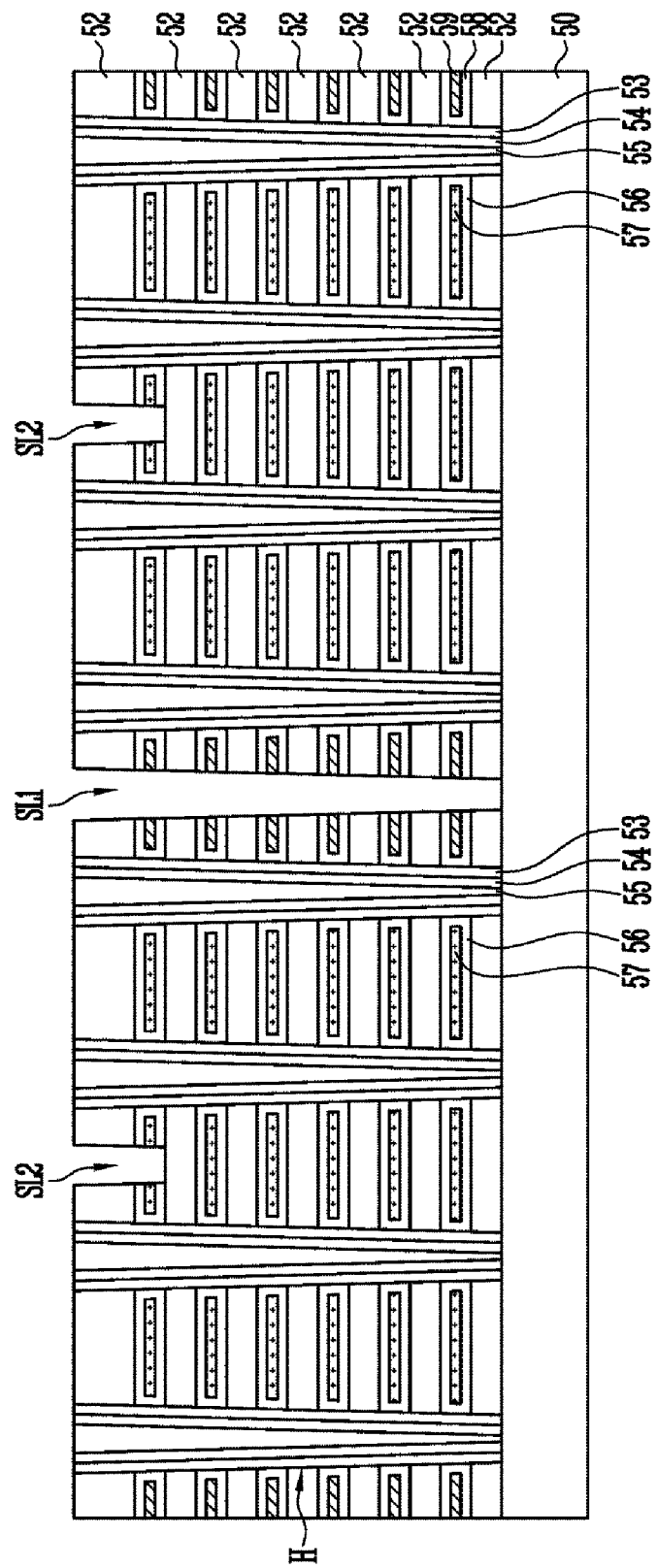

FIG. 6C is a cross-sectional view illustrating a semiconductor device according to an embodiment, with the lay out described above in FIG. 6A reflected. In this figure, the channel layers CH with the centers having been offset are shown for clarification purposes. Hereinafter, the method of manufacturing the semiconductor device will be briefly explained with reference to FIG. 6C, and description that is repetitive will be omitted.

The plurality of first material layers (not shown) and the plurality of second material layers 52 may be alternately formed over the substrate 50 comprising the source layer (not shown). Thereafter, the plurality of holes H that pass through the plurality of first and second material layers 52 may be formed. Here, the holes H may be formed with a depth that exposes the source layer. Thereafter, the insulating layer 55 may be formed in the channel layer 54 after the first memory layer 53 and the channel layer 54 are formed in the holes H. And there may be formed the plurality of first slits SL1 that expose the source layer of the substrate 50 by passing through the plurality of first and second material layers 52. Thereafter, the plurality of second slits SL2 that pattern the conductive layer of at least one layer of the top part into a linear shape may be formed. Processes for forming the first conductive layer 56, the non-conductive material layer 57, the second conductive layer 58 and the third conductive layer 59 may be performed in the same way as described above.

Figure 7A:
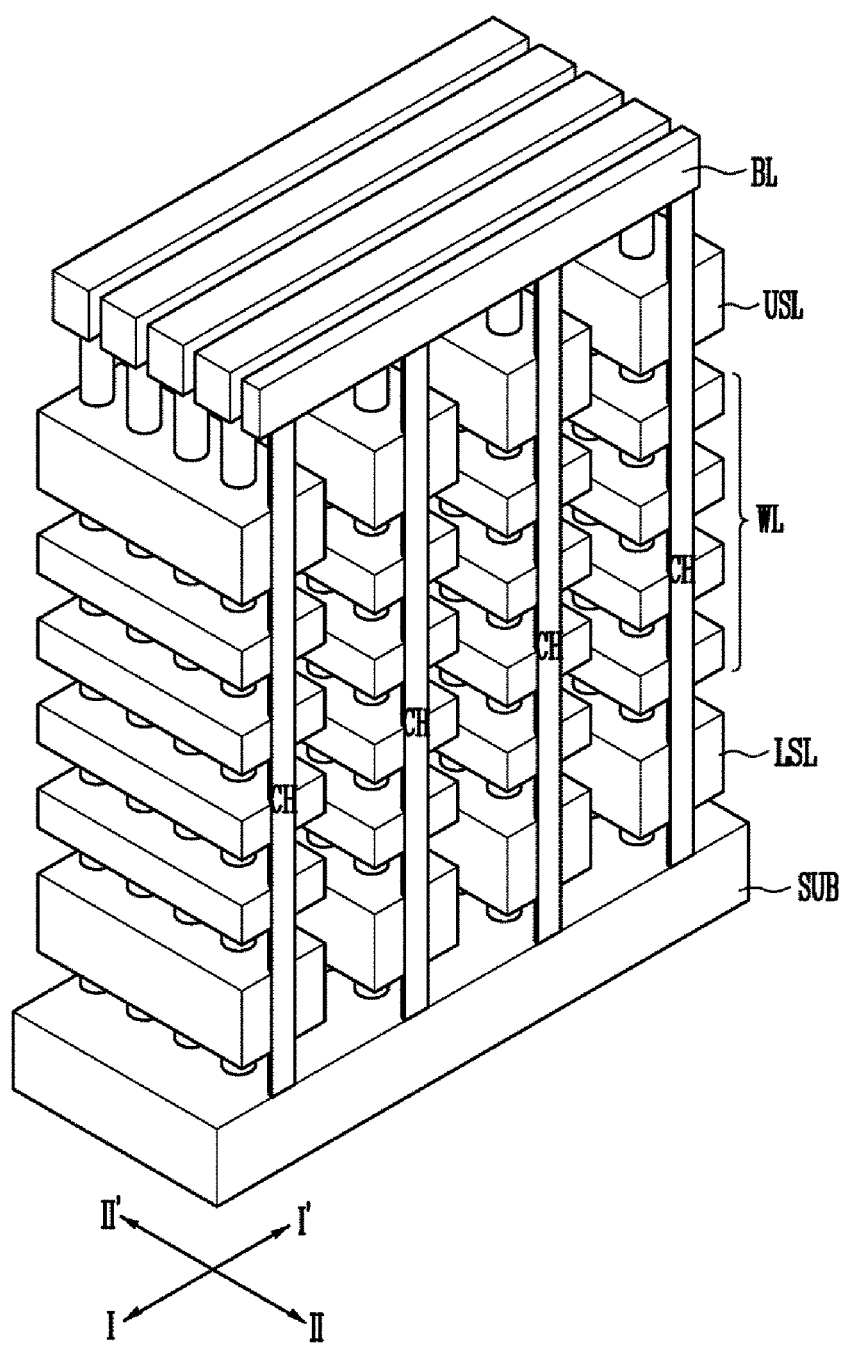
FIGS. 7A to 7C illustrate a semiconductor device and a method of the same according to an embodiment.
Figure 7B:
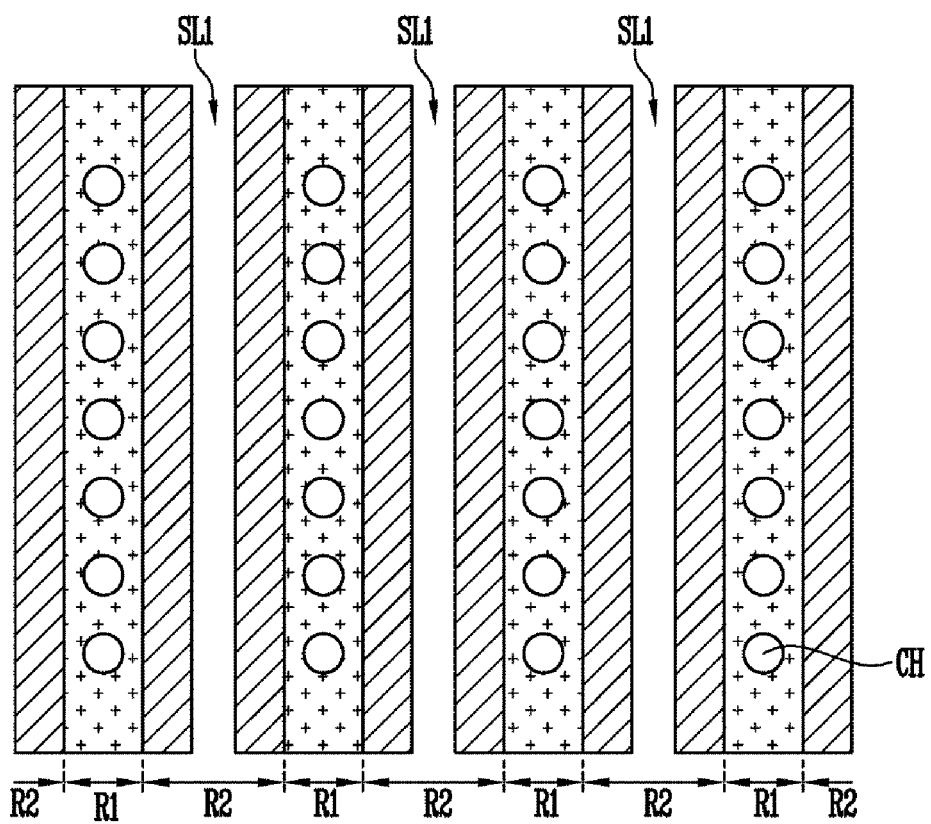
Figure 7C:
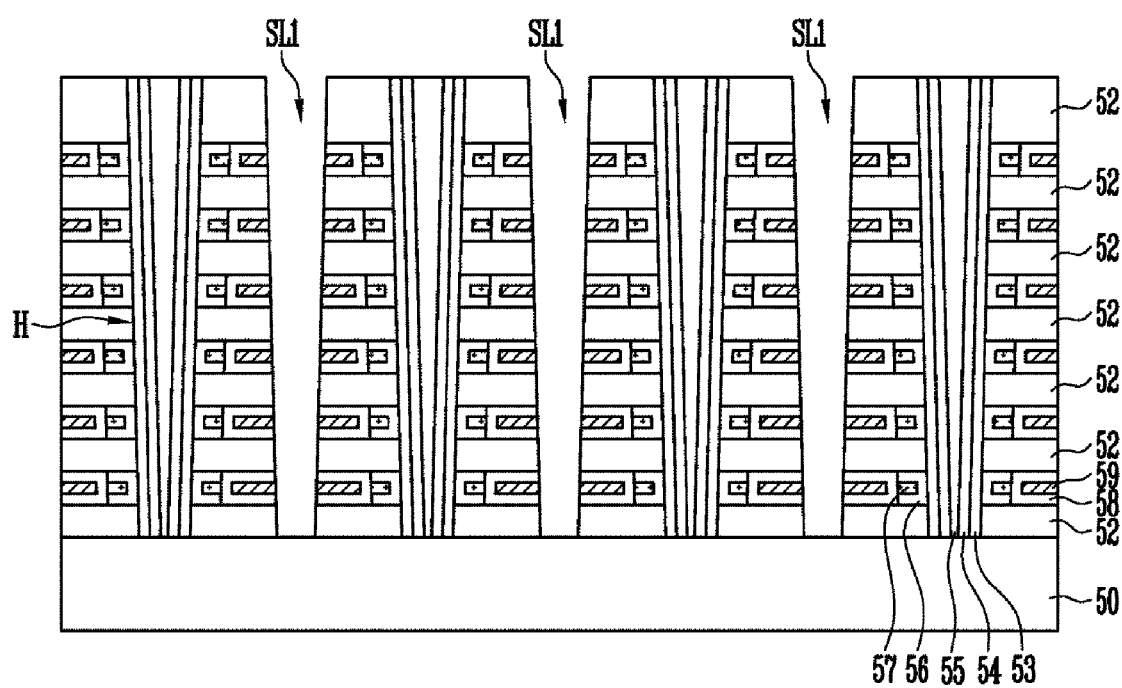

FIG. 7A is a perspective view illustrating a semiconductor device according to an embodiment, FIG. 7B is a lay out view and FIG. 7C is a cross-sectional view.

As shown in FIGS. 7A to 7C, the semiconductor device according to the embodiments may be a stacked structure including at least one of the lower selection lines LSL, the plurality of word lines WL and at least one of the upper selection lines USL over the substrate SUB. FIG. 7A also shows bit lines BL.

Here, the lower selection line LSL, the word lines WL, and the upper selection line USL may be patterned into linear shapes by the first slits SL1 while surrounding the pillar rows. All other structures and manufacture methods are the same as described above with reference to FIGS. 6A to 6C.

In FIGS. 7B and 7C, it is shown that the first conductive layer 56 and the non-conductive material layer 57 in the first conductive layer 56 are formed in the first region R1 and the second conductive layer 58 and the third conductive layer 59 in the second conductive layer 58 are formed in the second region R2, which, however, may change with reference to various embodiments described above. For example, in the process of removing the non-conductive material layer 57 of the second region R2, the non-conductive material layer 57 of the first region R1 may be removed together, and the second conductive layer 58 may be formed in a region where the non-conductive material layer 57 of the first region R1 is removed.

Figure 8A:
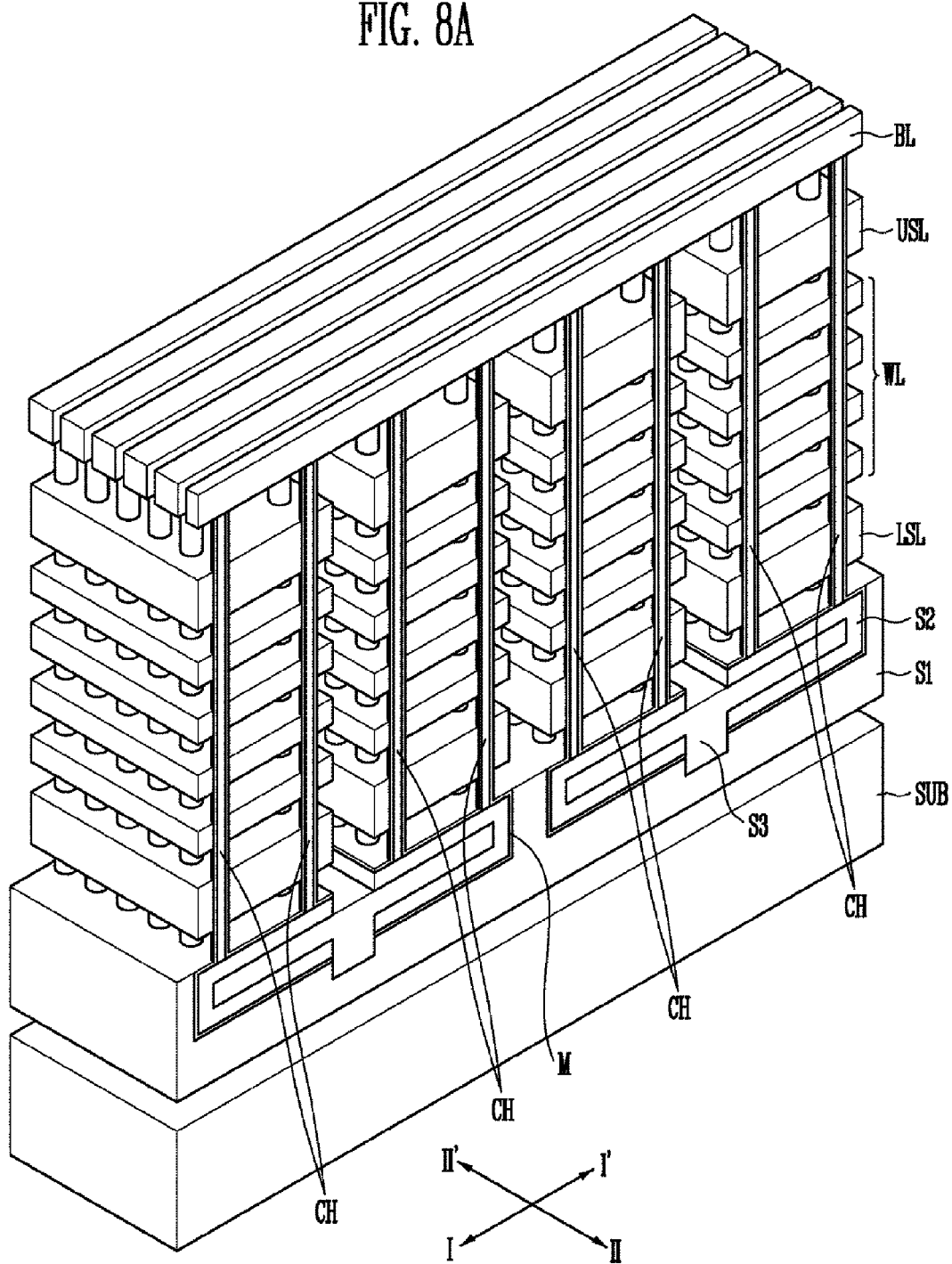

FIG. 8A is a perspective view illustrating a semiconductor device according to an embodiment. As shown in FIG. 8A, the semiconductor device according to the embodiments may include source layers S1 to S3, at least one of the lower selection lines LSL, the plurality of word lines WL and at least one of the upper selection lines USL, sequentially stacked.

Here, the source layers S1 to S3 may include the first source layer S1, the third source layer S3 in the first source layer S1, the second source layer S2 between the first source layer S1 and the third source layer S3 while surrounding the third source layer S3. Also, the third source layer S3 is coupled to the first source layer S1 by passing through the second source layer S2. Here, the first and second source layers S1 and S2 may include polysilicon layers, and the third source layer S3 may include a metal layer such as tungsten W, etc.

The semiconductor device may further include the plurality of cannel layers CH protruded from an upper surface of the second source layer S2. At least one of the lower selection lines LSL, the plurality of word lines WL and at least one of the upper selection lines USL may be stacked while surrounding the plurality of channel layers CH. Here, the channel layers CH may be formed in one body with the second source layer S2. Also, the upper portions of the channel layers CH may be coupled to the bit lines BL.

The semiconductor device may further include the memory layers M between the channel layers CH and the word lines WL. Here, the memory layer M may be formed such that the memory layer M surrounds outer surfaces of the channel layers CH and outer surfaces of the second source layers S2.

In this structure, at least one of the lower selection transistors, the plurality of memory cells, and at least one of the upper selection transistors, coupled in series, may form one string, and the strings may be arranged in vertical shapes.

Figure 8B:
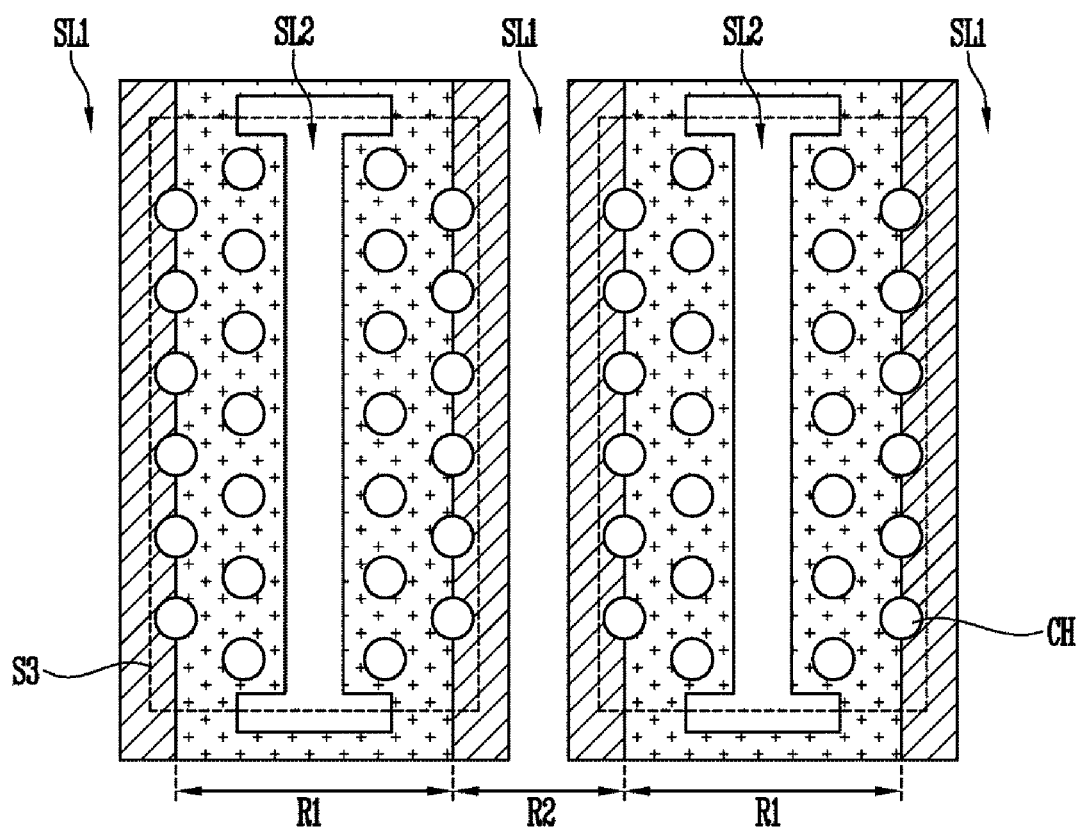

FIG. 8B is a lay out view illustrating a conductive layer included in a semiconductor device according to an embodiment. The figure may be a lay out view of, for example, the lower selection lines LSL, the word lines WL, or the upper selection lines USL.

As shown in FIG. 8B, the conductive layer may be defined by the plurality of first regions R1 and the plurality of second regions R2, the first regions R1 and the second regions R2 alternating each other. Also, the conductive layer may be patterned by the plurality of first and second slits SL1 and SL2 that pass through the conductive layer. The plurality of first slits SL1 may be provided at the second regions R2 and pass through the conductive layer, and the plurality of second slits SL2 may be provided at the first region R1 and pass through the conductive layer. Also, the third source layer S3 may be provided under the channel layers CH (refer to dotted line).

FIG. 8C is a cross-sectional view illustrating a semiconductor device according to an embodiment. Referring to FIG. 8C, a method of manufacturing the semiconductor device will be examined. For convenience, description that is repetitive will be omitted.

After the interlayer insulating layer 61 is formed over the substrate 60, the first source layer 62 may be formed over the interlayer insulating layer 61. The sacrificial layers (not shown) may be formed in the trenches T after the plurality of trenches T are formed in the first source layer 62. The plurality of first material layers (not shown) and the plurality of second material layers 64 may be alternately formed over the first source layer 62 where the sacrificial layer is formed. The plurality of holes H may be formed that pass through the plurality of first and second material layers 64. The holes H may be coupled to the trenches T. After the sacrificial layers are removed in the trenches T through the holes H, the memory layer 65 may be formed in the trenches T and the holes H. A semiconductor layer may be formed over the memory layer 65. The semiconductor layer having a thickness in which insides of the trenches T are not completely filled but in which coupling portions of the trenches T and the holes H are completely filled may be formed. There may be formed the second slits SL2 having a depth that extends to the first source layer 62 by passing through the plurality of first and second material layers 64 and the trenches T. The second source layer 66A may be formed by doping impurities in a horizontal region of the semiconductor layer through the second slits SL2. A vertical region of the semiconductor layer that is not doped with the impurities may be the channel layer 66B. An insulating layer 67 may be formed within the channel layer 66B or the second source layer 66A as illustrated in FIG. 8C. The third source layer 68 may be formed under the second slits SL2 and in the trenches T. The third source layer 68 may be formed of a metal layer such as a tungsten layer, etc. The insulating layer 69 may be formed in a remaining region of the second slits SL2. After the plurality of first slits SL1 are formed that pass through the plurality of first and second material layers 64, the first material layers exposed in the first slits SL1 may be removed to form the recess regions RC. Processes for forming the first conductive layer 70, the non-conductive material layer 71, the second conductive layer 72 and the third conductive layer 73 may be performed in the same way as described above.

Figure 9:
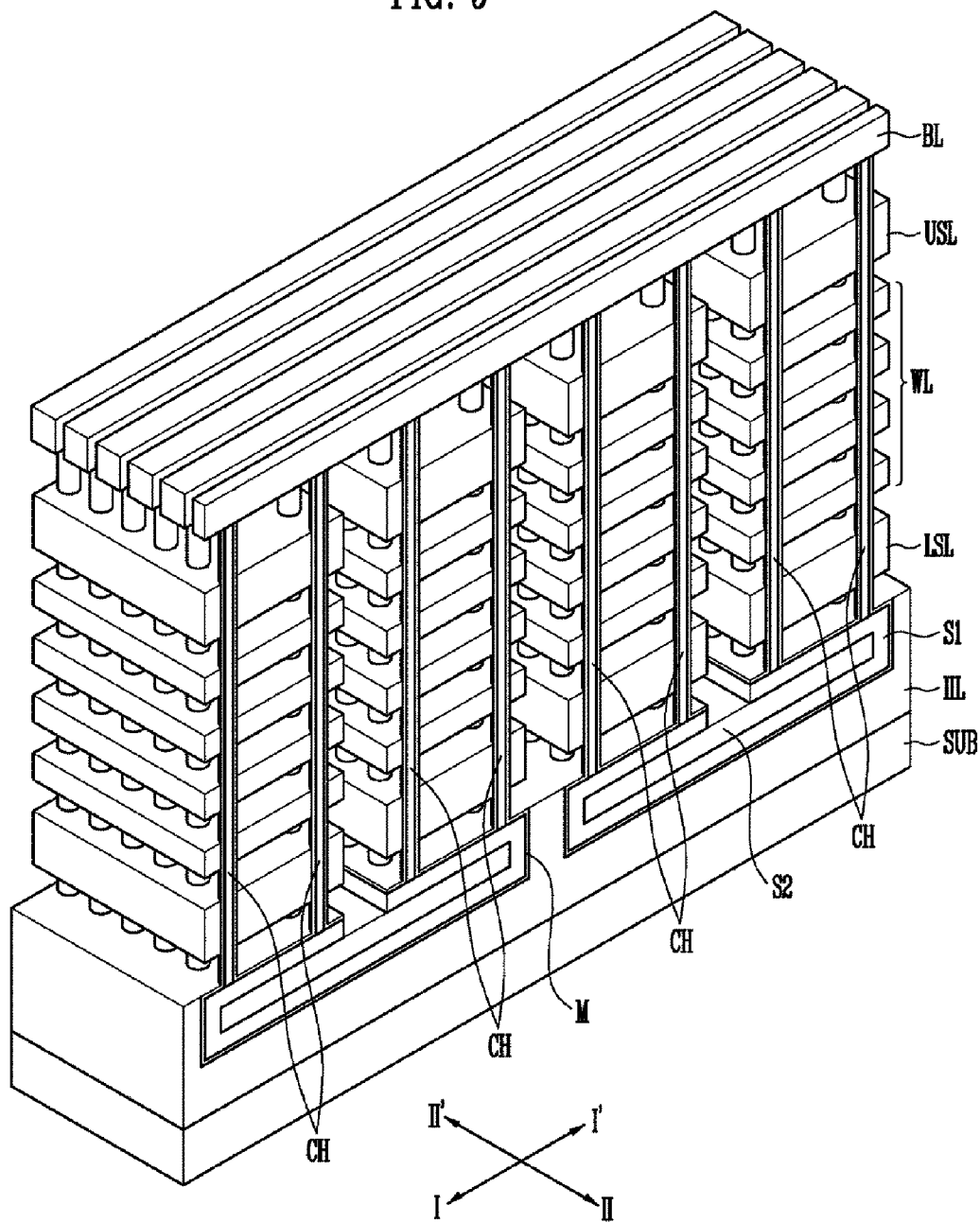
FIG. 9 is a perspective view illustrating a semiconductor device according to an embodiment.

FIG. 9 is a perspective view illustrating a semiconductor device according to an embodiment.

As shown in FIG. 9, the semiconductor device according to the embodiments may include, sequentially stacked, the interlayer insulating layer IIL, at least one of the lower selection lines LSL, the plurality of word lines WL and at least one of the upper selection lines USL and may include the first source layer S1 formed in the interlayer insulating layer IIL and the second source layer S2 formed in the first source layer S1.

These embodiments are characterized by the first and second source layers S1 and S2 formed in the interlayer insulating layer IIL. All other structures are similar to those described above with reference to FIGS. 8A to 8C. Although this figure shows that the first source layer S1 completely surrounds a lower surface of the second source layer S2, a part of the lower surface of the second source layer S2 may protrude and pass through the first source layer S1.

The semiconductor device according to the embodiments may be manufactured using the method of manufacturing described above with reference to FIG. 8C. For example, after the interlayer insulating layer IIL is formed instead of the first source layer 62, the trench may be formed in the interlayer insulating layer IIL. The second and third source layers 66A and 66B in FIG. 8C correspond to the first and second source layers S1 and S2 in FIG. 9, and so description that is repetitive will be omitted.

Figure 10:
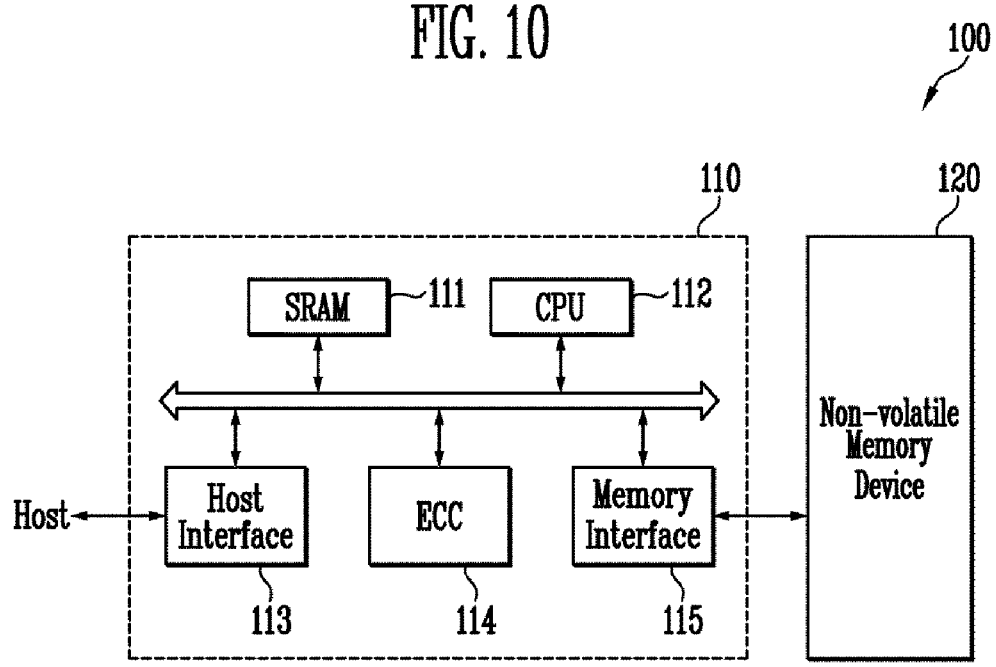
FIG. 10 is a block diagram illustrating a memory system according to an embodiment.

FIG. 10 is a block diagram showing a memory system according to an embodiment.

As shown in FIG. 10, the memory system 100 according to the embodiments may include the non-volatile memory device 120 and a memory controller 110.

The non-volatile memory device 120 may be structured as described above. Also, the non-volatile memory device 120 may be a multi-chip package having a plurality of flash memory chips.

The memory controller 110 may be configured to control the non-volatile memory device 120 and may include a SRAM 111, a CPU 112, a host interface 113, an ECC 114 and a memory interface 115. The SRAM 111 may be used as an operating memory of the CPU 112, the CPU 112 may perform various control operations for exchanging data of the memory controller 110 and the host interface 113 may include a data exchange protocol of the host accessing the memory system 100. Also, the ECC 114 may detect and correct an error included in the data read from the non-volatile memory device 120, and the memory interface 115 may perform interfacing with the non-volatile memory device 120. The memory controller 110 may further include a ROM storing code data for interfacing with the host, etc.

The memory system 100 having such configuration may be a memory card or a solid state disk SSD in which the memory device 120 and the controller 110 are coupled. For example, if the memory system 100 is the SSD, the memory controller 110 may communicate with the outside (for example, a host) through one of the various interface protocols such as USB, MMC, PCIE, SATA, PATA, SCSI, ESDI, IDE, etc.

Figure 11:
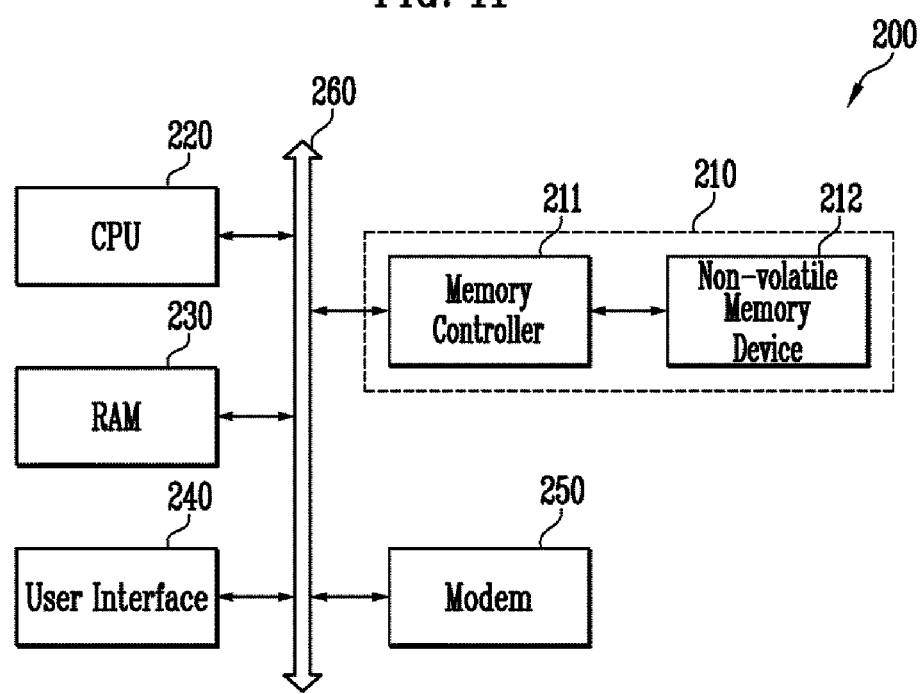
FIG. 11 is a block diagram illustrating a computing system according to an embodiment.

FIG. 11 is a block diagram showing a computing system according to an embodiment.

As shown in FIG. 11, the computing system 200 according to the embodiments may include, coupled to a system bus 260, a CPU 220, a RAM 230, a user interface 240, a modem 250 and a memory system 210. Additionally, the system bus 260 may be electrically connected to input and output devices (not shown) such as, without limitation, a self-contained display in the case of a portable electronic device, a physical keyboard or virtual keyboard, trackball, touchpad, or other cursor control device, etc. Also, if the computing system 200 is a mobile device, a battery may be further included to supply an operating voltage to the computing system 200. An application chipset, a camera image processor CIS, a mobile D-RAM, etc. may be further included.

The memory system 210 may, as described with reference to FIG. 10, include the non-volatile memory device 212 and the memory controller 211.

By way of review and summation, a semiconductor device according to an embodiment of the present invention may include pillars; and a plurality of conductive layers having a plurality of first regions including non-conductive material layers and a plurality of second regions including conductive material layers, wherein the plurality of first regions and the plurality of second regions are alternately arranged.

There may be formed a plurality of first regions which include non-conductive material layers and a plurality of second regions which include conductive material layers, wherein the first regions and the second regions are alternately arranged. Accordingly, the difficulty with a process of manufacturing is reduced, and damage to peripheral layers can be prevented.

Various examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   pillars each including a channel layer and a memory layer surrounding the channel layer, wherein the memory layer includes at least one of a charge blocking layer, a data storage layer or a tunnel insulating layer; and
   a plurality of conductive layers being stacked while surrounding the pillars and including a plurality of first regions having non-conductive material layers and a plurality of second regions having conductive material layers, wherein the non-conductive material layers and the conductive material layers are alternately arranged along a horizontal direction crossing the pillars,
   wherein each of the non-conductive material layers fills a space between the pillars and is formed on the memory layer.

2. The semiconductor device according to claim 1, wherein each of the non-conductive material layers includes at least one of an oxide layer, a nitride layer, a silicon oxide layer, a silicon nitride layer, a polysilicon layer, a germanium layer and a silicon germanium layer.

3. The semiconductor device of claim 1, wherein the first regions of each of the conductive layers include first conductive layers and the non-conductive material layers in the first conductive layers and the second regions of each of the conductive layers include second conductive layers and third conductive layers in the second conductive layers.

4. The semiconductor device of claim 3, further comprising air gaps in the non-conductive material layers.

5. The semiconductor device of claim 4, wherein the second conductive layers extend into insides of the air gaps.

6. The semiconductor device of claim 3, wherein the first conductive layers and the second conductive layers are barrier layers, and the third conductive layers include metal layers.

7. The semiconductor device of claim 6, wherein the barrier layers include at least one of a titanium layer, a titanium nitride layer, a tantalum layer and a tantalum nitride layer, and the metal layers include at least one of a tungsten layer and a tungsten nitride layer.

8. The semiconductor device of claim 1, wherein the first regions of each of the conductive layers include first conductive layers and the non-conductive material layers in the first conductive layers, and the second regions include the first conductive layers and third conductive layers in the first conductive layers.

9. The semiconductor device of claim 8, further comprising air gaps in the non-conductive material layers.

10. The semiconductor device of claim 8, wherein the first conductive layers are barrier layers, and the third conductive layers include metal layers.

11. The semiconductor device of claim 10, wherein the barrier layer includes at least one of a titanium layer, a titanium nitride layer, a tantalum layer and a tantalum nitride layer, and the metal layers include at least one of a tungsten layer and a tungsten nitride layer.

12. The semiconductor device of claim 1, wherein the second regions are non-overlapped with the pillars.

13. The semiconductor device of claim 1, wherein the second regions overlap some of the pillars.

14. The semiconductor device of claim 13, wherein the second regions completely surround outer surfaces of the overlapped pillars.

15. The semiconductor device of claim 13, wherein the second regions partially surround outer surfaces of the overlapped pillars.

16. The semiconductor device of claim 1, further comprising a plurality of first slits passing through the second regions of the conductive layers.

17. The semiconductor device of claim 16, further comprising a pipe channel layer coupling at least two of the pillars, wherein the first slits are between the at least two pillars coupled by the pipe channel layer.

18. The semiconductor device of claim 16, further comprising source layers coupled to the pillars, wherein the first slits are between the source layers.

19. The semiconductor device of claim 1, further comprising a plurality of second slits between neighboring memory blocks and passing through the first regions of the conductive layers.

20. A semiconductor device comprising:
    pillars;
    conductive patterns surrounding at least two rows of the pillars; and
    first slits defining edges of the conductive patterns, wherein the conductive patterns surrounding the at least two rows of the pillars are disposed between the first slits,
    wherein each of the conductive patterns includes a center region having a non-conductive layer and side regions having conductive material layers,
    wherein the conductive material layers and the non-conductive layer are disposed on a same horizontal plane.

21. The semiconductor device of claim 20, wherein the center region of each of the conductive patterns includes a first conductive layer and the non-conductive material layer in the first conductive layer, and the side regions of each of the conductive patterns includes a second conductive layer and a third conductive layer in the second conductive layer.

22. The semiconductor device of claim 21, wherein the center region of each of the conductive patterns includes a first conductive layer and the non-conductive material layer in the first conductive layer, and the side regions of each of the conductive patterns include the first conductive layer and a third conductive layer in the first conductive layer.

23. The semiconductor device of claim 20, further comprising an air gap in the non-conductive material layer.

24. A semiconductor device, comprising:
    pillars extending in a first direction; and a plurality of conductive layers being stacked while surrounding the pillars and including a plurality of first regions having air gaps and a plurality of second regions having conductive material layers, wherein the first regions and the second regions are alternately arranged; and a plurality of insulating layers being stacked while surrounding the pillars, the insulating layers and the conductive layers alternately stacked along the pillars;

wherein each of the first regions is defined between the pillars disposed between neighboring second regions, and wherein each of the air gaps is arranged between the insulating layers neighboring in the first direction, and is formed without cutting between neighboring pillars in a second direction crossing the conductive layers.

25. The semiconductor device of claim 24, wherein the first regions of each of the conductive layers include first conductive layers and the air gaps in the first conductive layers, and the second regions of each of the conductive layers include second conductive layers and third conductive layers in the second conductive layers.

26. The semiconductor device of claim 24, wherein the first regions of each of the conductive layers include first conductive layers and the air gaps in the first conductive layers, and the second regions of each of the conductive layers include the first conductive layers and third conductive layers in the first conductive layers.

27. The semiconductor device of claim 24, wherein the first regions of each of the conductive layers include first conductive layers, and the second regions of each of the conductive layers include second conductive layers and third conductive layers in the second conductive layers, wherein the first regions of each of the conductive layers further include fourth conductive layers in which the air gaps are formed.

28. The semiconductor device of claim 27, wherein the first conductive layers and the second conductive layers are barrier layers, the third conductive layers include metal layers, and the fourth conductive layers include a doped polysilicon layers.

* * * * *